(12) United States Patent
Kaeriyama

(10) Patent No.: US 9,166,738 B2
(45) Date of Patent: *Oct. 20, 2015

(54) SEMICONDUCTOR DEVICE AND DATA TRANSMISSION METHOD

(71) Applicant: Renesas Electronics Corporation, Kawasaki-shi, Kanagawa (JP)

(72) Inventor: Shunichi Kaeriyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/575,045

(22) Filed: Dec. 18, 2014

(65) Prior Publication Data

US 2015/0103950 A1    Apr. 16, 2015

Related U.S. Application Data

(63) Continuation of application No. 13/860,040, filed on Apr. 10, 2013, now Pat. No. 8,948,276.

(30) Foreign Application Priority Data

Apr. 26, 2012  (JP) ................................ 2012-101655

(51) Int. Cl.
*H04L 1/00* (2006.01)
*H04L 25/02* (2006.01)

(52) U.S. Cl.
CPC .............. *H04L 1/0041* (2013.01); *H04L 25/02* (2013.01); *H01L 2224/48137* (2013.01); *H01L 2924/1305* (2013.01); *H01L 2924/13055* (2013.01)

(58) Field of Classification Search
CPC .............. H01L 23/5227; H01L 23/645; H04L 25/0266; H04L 25/493; H01F 19/08; H01F 2019/085; H01F 2038/143; H03K 5/1252
USPC ............................................. 375/358; 363/64
See application file for complete search history.

(56) References Cited

U.S. PATENT DOCUMENTS

| 5,625,265 | A  | 4/1997  | Vlahu |
| 6,262,600 | B1 | 7/2001  | Haigh et al. |
| 7,075,329 | B2 | 7/2006  | Chen et al. |
| 7,302,247 | B2 | 11/2007 | Dupuis |

OTHER PUBLICATIONS

Shunichi Kaeriyama, et al. "A 2.5kV isolation 35kV/us CMR 250Mbps 0.13mA/Mbps Digital Isolator in Standard CMOS with an on-chip small transformer", Symposium on VLSI Circuits/Technical Digest of Technical Papers, 2010, pp. 197-198.

*Primary Examiner* — Vineeta Panwalkar
(74) *Attorney, Agent, or Firm* — Sughrue Mion, PLLC

(57) ABSTRACT

In a semiconductor device, a transmitting circuit generates a delayed data signal and a first delayed retransmission request signal by delaying a data signal and a first retransmission request signal, respectively, and outputs a pulse signal at an edge of the delayed data signal and the first delayed retransmission request signal and prohibits output of the pulse signal at an edge of the first delayed retransmission request signal during a specified period across an edge of the delayed data signal.

13 Claims, 26 Drawing Sheets

SEMICONDUCTOR DEVICE AND DATA TRANSMISSION METHOD

CROSS-REFERENCE TO RELATED APPLICATIONS

This application is a continuation of U.S. application Ser. No. 13/860,040, filed Apr. 10, 2013, which is based upon and claims the benefit of priority from Japanese patent application No. 2012-101655, filed on Apr. 26, 2012, the disclosures of which are incorporated herein in their entirety by reference.

BACKGROUND

The present invention relates to a semiconductor device and a data transmission method and, for example, to a semiconductor device including an insulation coupler and a data transmission method.

When transmitting and receiving signals between a plurality of semiconductor chips with different power supply voltages, it is necessary to provide electrical insulation between the semiconductor chips using an insulation coupler and transmit and receive signals. As the insulation coupler, an AC coupler using a capacitor, coil or the like, a photo coupler and the like are known. A semiconductor device that transmits and receives signals using a coil as the insulation coupler is disclosed in U.S. Pat. No. 6,262,600, U.S. Pat. No. 7,075,329, U.S. Pat. No. 7,302,247, and Kaeriyama et al. ("A 2.5 kV isolation 35 kV/us CMR 250 Mbps 0.13 mA/Mbps digital isolator in standard CMOS with an on-chip small transformer", 2010 Symposium on VLSI Circuits, Technical Digest of Technical Papers, 2010, pp 197-198).

In the case of transmitting a data signal from a transmitting circuit on one semiconductor chip to a receiving circuit on another semiconductor chip using an insulation coupler, according to the technique disclosed in U.S. Pat. No. 6,262,600, a pulse signal is transmitted during the period when the data signal is H (High) level and not transmitted during the period when the data signal is L (Low) level.

On the other hand, according to the technique disclosed in Kaeriyama et al. and U.S. Pat. No. 7,075,329, a pulse signal is transmitted once or twice from the transmitting circuit, triggered by the edge of the data signal. The pulse signal that allows distinction between the rising edge and the falling edge of the data signal is transmitted from the transmitting circuit. Thus, the data signal can be restored in the receiving circuit.

Because the technique disclosed in Kaeriyama et al. and U.S. Pat. No. 7,075,329 transmits the pulse signal only at the edge of the data signal, it has an advantage over the technique disclosed in U.S. Pat. No. 6,262,600 that keeps outputting the pulse signal during the period when the data signal is H level in that power consumption and radiation noise are lower. Note that the both techniques are disclosed in U.S. Pat. No. 7,302,247.

SUMMARY

The present inventor has found the following problem.

Although the technique that transmits a pulse signal only at the edge of a data signal has the above advantages, there is a possibility that the value of the data signal is inverted due to noise, for example. To correct such an error, it is preferred to retransmit the value of the data signal from the transmitting circuit at some timing (for example, on a regular basis) in response to a retransmission request signal and thereby maintain or update the value of the data signal to a correct value.

However, when the edge of the data signal and the edge of the retransmission request signal are too close, there is a possibility that the data signal is wrongly restored in the receiving circuit.

The other problems and novel features of the present invention will become apparent from the description of the specification and the accompanying drawings.

According to one embodiment, a transmitting circuit generates a delayed data signal and a first delayed retransmission request signal by delaying a data signal and a first retransmission request signal, respectively, and outputs a pulse signal at an edge of the delayed data signal and the first delayed retransmission request signal and prohibits output of the pulse signal at an edge of the first delayed retransmission request signal during a specified period across an edge of the delayed data signal.

According to the above embodiment, it is possible to prevent the data signal from being wrongly restored in the receiving circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Specific embodiments of the present invention will be described hereinbelow with reference to the drawings. The present invention, however, is not limited to the below-described embodiments. The following description and the appended drawings are appropriately shortened and simplified to clarify the explanation.

First Embodiment

Figure 1:
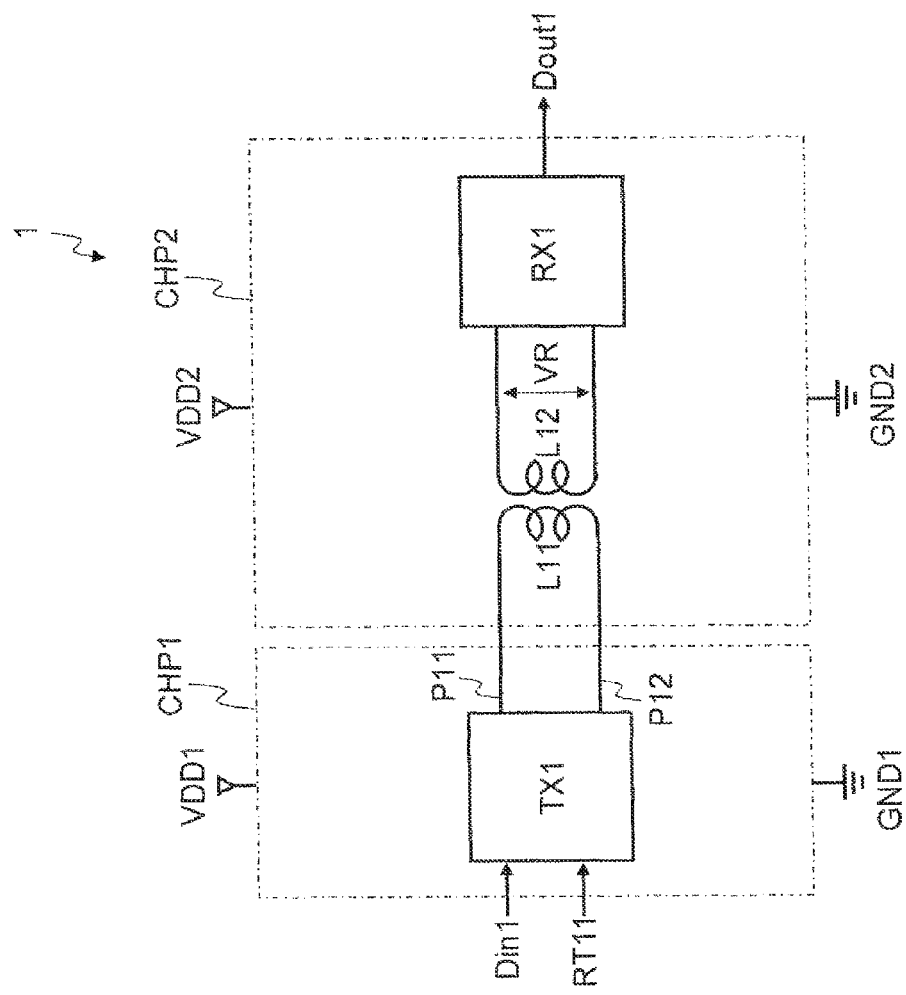
FIG. 1 is a block diagram showing a semiconductor device according to a first embodiment.

A semiconductor device according to a first embodiment is described hereinafter with reference to FIG. 1. FIG. 1 is a block diagram showing a semiconductor device 1 according to the first embodiment. The semiconductor device 1 according to the first embodiment includes a transmitting circuit TX1, a primary coil L11, a secondary coil L12 and a receiving circuit RX1 and thereby forms an isolator.

The transmitting circuit TX1 is formed on a semiconductor chip CHP1. Note that the semiconductor chip CHP1 is driven by a first power supply (power supply voltage VDD1, ground voltage GND1) belonging to a first power supply system.

The primary coil L11, the secondary coil L12 and the receiving circuit RX1 are formed on a semiconductor chip CHP2. Note that the semiconductor chip CHP2 is driven by a second power supply (power supply voltage VDD2, ground voltage GND2) belonging to a second power supply system, which is different from the first power supply system.

The primary coil L11 and the secondary coil L12 form an insulation coupler that couples the two semiconductor chips CHP1 and CHP2 with different power supply voltages by a magnetic field or an electric field, as well as electrically insulating them. The insulation coupler allows transmission of a data signal from the transmitting circuit TX1 on the semiconductor chip CHP1 to the receiving circuit RX1 on the semiconductor chip CHP2 with a different power supply voltage.

Figure 2:
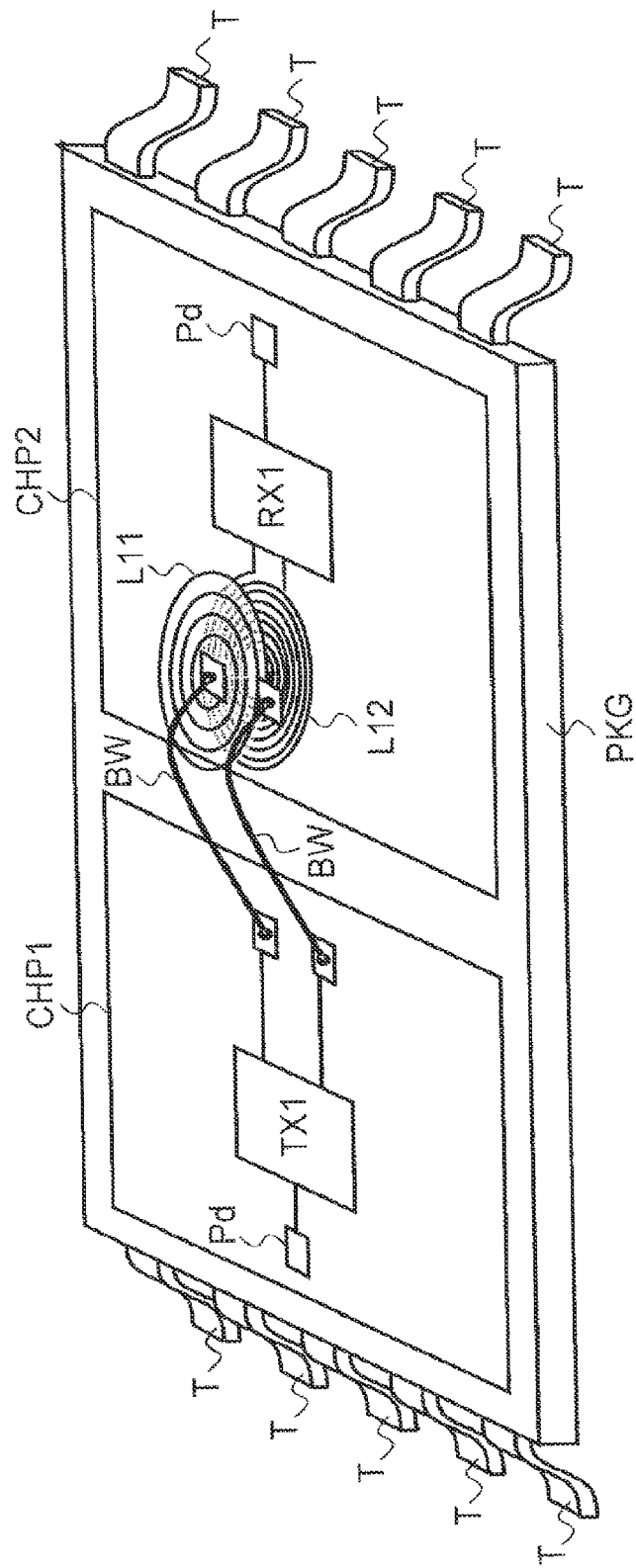
FIG. 2 is a schematic diagram showing an implementation example of the semiconductor device according to the first embodiment.

An implementation example of the semiconductor device 1 is described hereinafter with reference to FIG. 2. FIG. 2 is a diagram showing an implementation example of the semiconductor device 1. Note that FIG. 2 mainly illustrates an implementation example of the transmitting circuit TX1 and the receiving circuit RX1, and the primary coil L11 and the secondary coil L12 connected between those circuits.

In the implementation example shown in FIG. 2, the two semiconductor chips CHP1 and CHP2 are mounted on a semiconductor package PKG. Each of the semiconductor chips CHP1 and CHP2 has a pad Pd. The pad Pd of each of the semiconductor chips CHP1 and CHP2 is connected to a plurality of lead terminals (external terminals) T attached to the semiconductor package PKG through bonding wires, which are not shown.

As shown in FIG. 2, the transmitting circuit TX1 is formed on the semiconductor chip CHP1. The receiving circuit RX1, the primary coil L11 and the secondary coil L12 are formed on the semiconductor chip CHP2. Further, pads that are connected to the output of the transmitting circuit TX1 are formed on the semiconductor chip CHP1, and pads that are respectively connected to the both ends of the primary coil L11 are formed on the semiconductor chip CHP2. The transmitting circuit TX1 is connected to the primary coil L11 formed on the semiconductor chip CHP2 through those pads and bonding wires BW.

Note that, in the example shown in FIG. 2, the primary coil L11 and the secondary coil L12 are respectively formed in a first wiring layer and a second wiring layer that are stacked on top of one another in one semiconductor chip.

Referring back to FIG. 1, details of the configuration example of the semiconductor device 1 are described. The transmitting circuit TX1 operates based on the first power supply belonging to the first power supply system. On the other hand, the receiving circuit RX1 operates based on the second power supply belonging to the second power supply system.

The transmitting circuit TX1 outputs transmission pulse signals P11 and P12 at the edge of an input data signal Din1 and a retransmission request signal RT11. In this embodiment, the transmission pulse signal P11 is a pulse signal for transmitting H level (for example, first level) and is output to one end of the primary coil L11. On the other hand, the transmission pulse signal P12 is a pulse signal for transmitting L level (for example, second level) and is output to the other end of the primary coil L11.

The primary coil L11 and the secondary coil L12 convert the transmission pulse signals P11 and P12 output from the transmitting circuit TX1 into a reception signal VR and transmit it to the receiving circuit RX1. Specifically, current flowing through the primary coil L11 changes by the transition of the transmission pulse signals P11 and P12, and the reception signal VR, which is a voltage between the both ends of the secondary coil L12, changes accordingly.

The receiving circuit RX1 restores the input data signal Din1 based on the reception signal VR of the secondary coil L12 and outputs it as an output data signal Dout1.

In the semiconductor device 1 according to this embodiment, the transmitting circuit TX1 generates a delayed data signal DD1 and a delayed retransmission request signal DRT11 (which are described later with reference to FIGS. 3 and 4) by delaying the input data signal Din1 and the retransmission request signal RT11, respectively, and prohibits the generation of the transmission pulse signals P11 and P12 at the edge of the delayed retransmission request signal DRT11 during a specified period of time across the edge of the delayed data signal DD1. It is thereby possible to prevent a data signal from being wrongly restored in the receiving circuit RX1.

Figure 3:
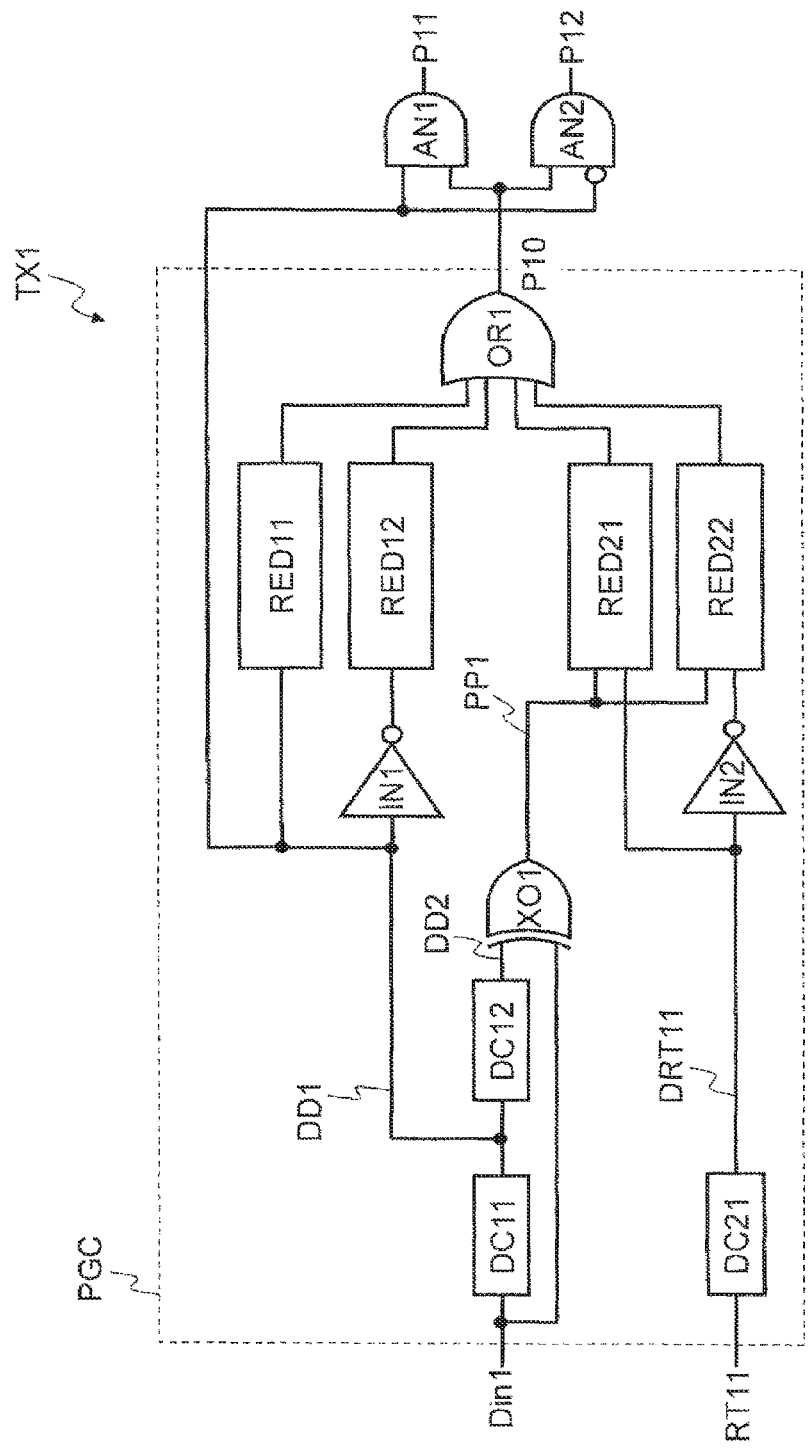
FIG. 3 is a circuit diagram showing an example of a specific circuit configuration of a transmitting circuit TX1 according to the first embodiment.

A specific circuit configuration of the transmitting circuit TX1 is described hereinafter with reference to FIG. 3. The circuit configuration described hereinbelow is just an example. FIG. 3 is a circuit diagram showing an example of a specific circuit configuration of the transmitting circuit TX1 according to the first embodiment. As shown in FIG. 3, the transmitting circuit TX1 is composed of a pulse generation circuit PGC and two AND gates AN1 and AN2. The pulse generation circuit PGC includes three delay circuits DC11, DC12 and DC21, one XOR gate XO1, two inverters IN1 and IN2, four rising edge detection circuits RED11, RED12, RED21 and RED22, and one OR gate OR1.

Connections are as follows.

The input data signal Din1 is input to the delay circuit DC11. The delay circuit DC11 outputs the delayed data signal DD1 (first delayed signal) that is generated by delaying the input data signal Din1 by a delay time Td. The delayed data signal DD1, not the input data signal Din1, is transmitted to the receiving circuit and restored as a data signal.

Thus, the delayed data signal DD1 is input to the rising edge detection circuit RED11. The rising edge detection circuit RED11 outputs an edge detection signal at the rising edge of the delayed data signal DD1.

Further, an inverted signal of the delayed data signal DD1 through the inverter IN1 is input to the rising edge detection circuit RED12. The rising edge detection circuit RED12 outputs an edge detection signal at the rising edge of the inverted signal of the delayed data signal DD1, which is the falling edge of the delayed data signal DD1.

Further, the delayed data signal DD1 is input to the delay circuit DC12. The delay circuit DC12 outputs a delayed data signal DD2 generated by further delaying the delayed data signal DD1 by a delay time Td.

The input data signal Din1 and the delayed data signal DD2 are input to the XOR gate XO1. The XOR gate XO1 outputs a prohibited period signal PP1 indicating a period of 2 Td from the edge of the input data signal Dint to the edge of the delayed data signal DD2. The prohibited period signal PP1 is a signal for prohibiting the edge detection of the delayed retransmission request signal DRT11 (second delayed signal), which is described later, during a period of Td before and after the edge of the delayed data signal DD1 (total 2 Td).

The retransmission request signal RT11 is input to the delay circuit DC21. The delay circuit DC21 outputs the delayed retransmission request signal DRT11 generated by delaying the retransmission request signal RT11 by a delay time Td. The value of the delayed data signal DD1 is retransmitted at the edge of the delayed retransmission request signal DRT11, not the retransmission request signal RT11.

Thus, the delayed retransmission request signal DRT11 is input to the rising edge detection circuit RED21. The rising edge detection circuit RED21 outputs an edge detection signal at the rising edge of the delayed retransmission request signal DRT11. The prohibited period signal PP1 is also input to the rising edge detection circuit RED21. Therefore, the rising edge detection circuit RED21 does not output the edge detection signal when the rising edge of the delayed retransmission request signal DRT11 is in the retransmission prohibited period (the period that is Td before and after the edge of the delayed data signal DD1).

Further, an inverted signal of the delayed retransmission request signal DRT11 through the inverter IN2 is input to the rising edge detection circuit RED22. The rising edge detection circuit RED22 outputs an edge detection signal at the rising edge of the inverted signal of the delayed retransmission request signal DRT11, which is the falling edge of the delayed retransmission request signal DRT11. The prohibited period signal PP1 is also input to the rising edge detection circuit RED22. Therefore, the rising edge detection circuit RED22 also does not output the edge detection signal when the falling edge of the delayed retransmission request signal DRT11 is in the retransmission prohibited period (the period that is Td before and after the edge of the delayed data signal DD1).

The edge detection signals that are output from the four rising edge detection circuits RED11, RED12, RED21 and RED22 are input to the OR gate OR1. The OR gate OR1 outputs a total pulse signal P10.

The total pulse signal P10 is input to the two AND gates AN1 and AN2. Further, the delayed data signal DD1 is input to the AND gate AN1. On the other hand, an inverted signal of the delayed data signal DD1 is input to the AND gate AN2.

As a result, the AND gate AN1 outputs the transmission pulse signal P11 that transmits H level at the timing when the total pulse signal P10 becomes active (H level). Further, the AND gate AN2 outputs the transmission pulse signal P12 that transmits L level at the timing when the total pulse signal P10 becomes active.

Figure 4:
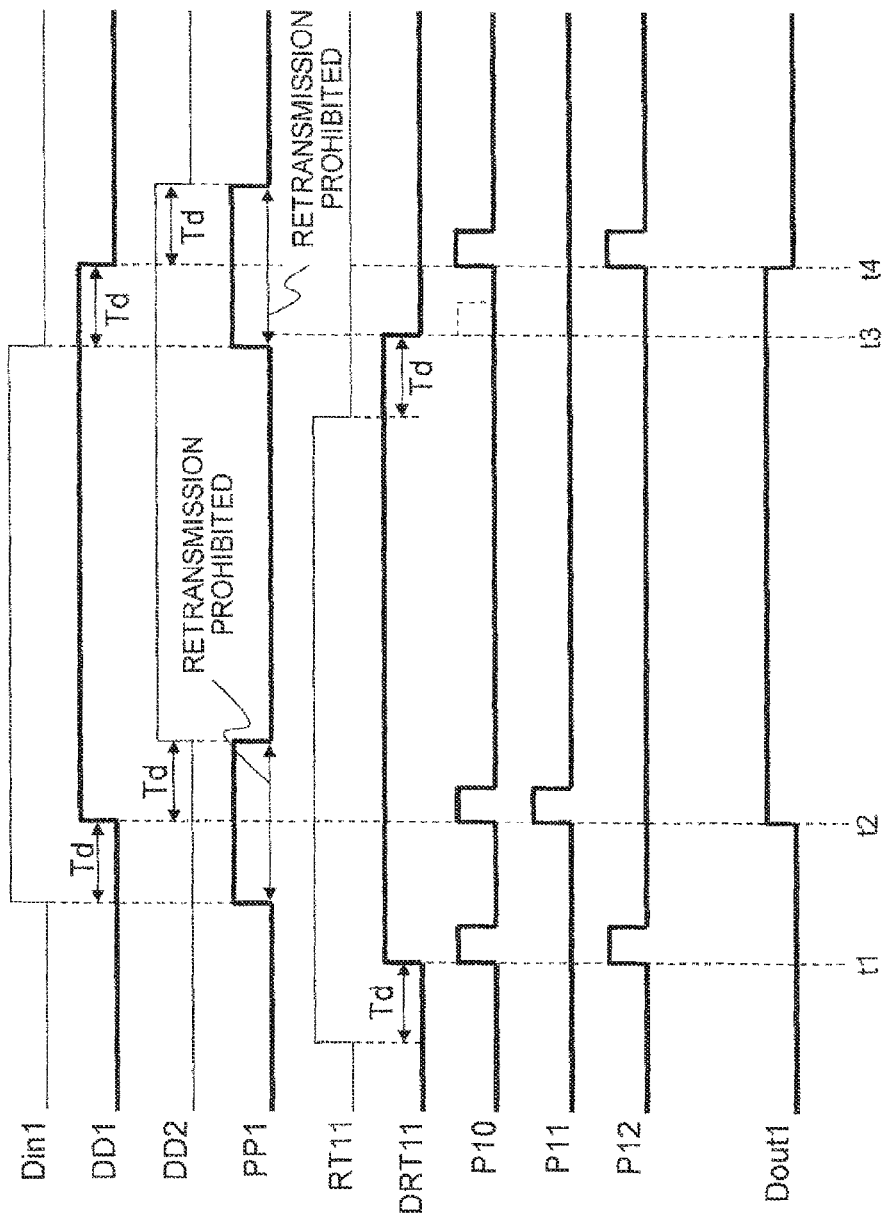
FIG. 4 is a timing chart showing an example of an operation of the transmitting circuit TX1 according to the first embodiment.

The operation of the transmitting circuit TX1 is described hereinafter with reference to FIG. 4. FIG. 4 is a timing chart showing an example of the operation of the transmitting circuit TX1 according to the first embodiment. Note that the operation shown in FIG. 4 can be also implemented in the same manner in the case where a capacitor, a GMR element or the like is used as the insulation coupler, not limited to the case where a coil is used as the insulation coupler.

In FIG. 4, the input data signal Din1, the delayed data signal DD1, the delayed data signal DD2, the prohibited period signal PP1, the retransmission request signal RT11, the delayed retransmission request signal DRT11, the total pulse signal P10, the transmission pulse signal P11, the transmission pulse signal P12 and the output data signal Dout1 are shown from above.

The delayed data signal DD1 shown in the second row is a signal generated by delaying the input data signal Din1 shown in the uppermost row by a delay time Td. As described above, the delayed data signal DD1 is restored as the output data signal Dout1 shown in the lowermost row.

The delayed data signal DD2 is a signal generated by further delaying the delayed data signal DD1 by a delay time Td.

The prohibited period signal PP1 is a period signal for prohibiting the edge detection of the delayed retransmission request signal DRT11 shown in the sixth row during a period of Td before and after the edge of the delayed data signal DD1. As described above, it can be easily generated from the input data signal Din1 and the delayed data signal DD2.

The delayed retransmission request signal DRT11 shown in the sixth row is a signal generated by delaying the retransmission request signal RT11 shown in the fifth row by a delay time Td. As described above, the value of the delayed data signal DD1 is retransmitted at the edge of the delayed retransmission request signal DRT11.

The operation is described in time series.

At time t1, the delayed retransmission request signal DRT11 changes from L level to H level (which is at the rising edge), and therefore the total pulse signal P10 is output (i.e. the total pulse signal P10 temporarily changes from L level to H level). Further, at time t1, the delayed data signal DD1 is L level, and therefore the transmission pulse signal P12 that transmits L level is output. As a result, L level is transmitted as the output data signal Dout1. Thus, the signal level of the output data signal Dout1 is maintained.

At time t2, the delayed data signal DD1 changes from L level to H level (which is at the rising edge), and therefore the total pulse signal P10 is output. Then, the transmission pulse signal P11 that transmits H level is output. As a result, H level is transmitted as the output data signal Dout1. Thus, the signal level of the output data signal Dout1 changes from L level to H level. Note that the period that is Td before and after time t2, which is the rising edge of the delayed data signal DD1, is the retransmission prohibited period.

At time t3, the delayed retransmission request signal DRT11 changes from H level to L level (which is at the falling edge); however, because it is during the retransmission prohibited period, the total pulse signal P10 is not output (i.e. the total pulse signal P10 remains at L level).

At time t4, the delayed data signal DD1 changes from H level to L level (which is at the falling edge), and therefore the total pulse signal P10 is output. Then, the transmission pulse signal P12 that transmits L level is output. As a result, L level is transmitted as the output data signal Dout1. Thus, the signal level of the output data signal Dout1 changes from H level to L level.

As described at time t3, when the edge of the delayed retransmission request signal DRT11 is close to the edge of the delayed data signal DD1 and located in the retransmission prohibited period, the total pulse signal P10 is not output. This prevents that the data signal is wrongly restored in the receiving circuit RX1.

Figure 5:
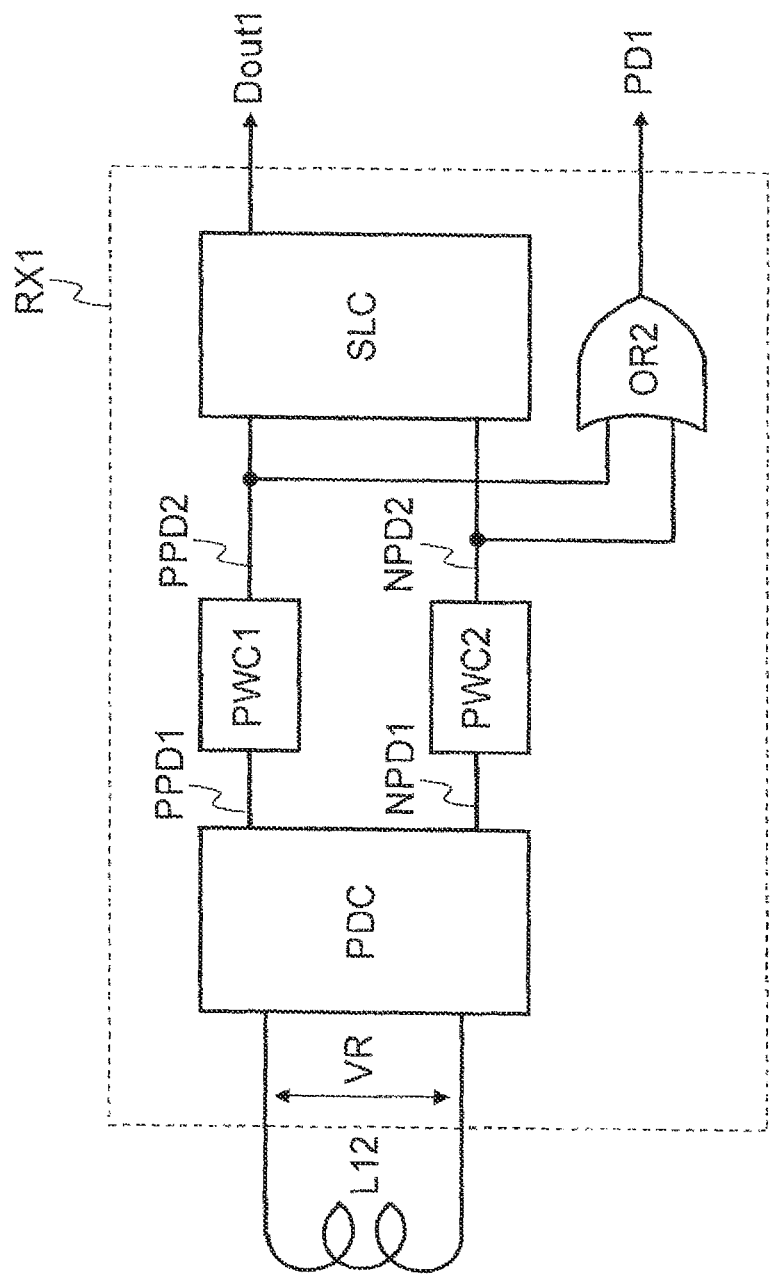
FIG. 5 is a circuit diagram showing an example of a specific circuit configuration of a receiving circuit RX1 according to the first embodiment.

A specific circuit configuration of the receiving circuit RX1 is described hereinafter with reference to FIG. 5. The circuit configuration described hereinbelow is just an example. FIG. 5 is a circuit diagram showing an example of a specific circuit configuration of the receiving circuit RX1 according to the first embodiment. As shown in FIG. 5, the receiving circuit RX1 is composed of a pulse detection circuit PDC, two pulse widening circuits PWC1 and PWC2, a sequential logic circuit SLC, and an OR gate OR2.

Connections are as follows.

The reception signal VR that is generated between the both ends of the secondary coil L12 in accordance with the transmission pulse signals P11 and P12 output from the transmitting circuit TX1 is input to the pulse detection circuit PDC. The pulse detection circuit PDC outputs a positive pulse detection signal PPD1 when detecting a positive pulse and outputs a negative pulse detection signal NPD1 when detecting a negative pulse. Specifically, when the transmission pulse signals P11 and P12 are output from the transmitting circuit TX1, a pair of the positive pulse detection signal PPD1 and the negative pulse detection signal NPD1 are output in any case. However, the output sequence of the positive pulse detection signal PPD1 and the negative pulse detection signal NPD1 is reversed between the transmission pulse signal P11 and the transmission pulse signal P12. In this embodiment, the positive pulse detection signal PPD1 is output first when the transmission pulse signal P11 is output, and the negative pulse detection signal NPD1 is output first when the transmission pulse signal P12 is output.

The positive pulse detection signal PPD1 is input to the pulse widening circuit PWC1, and the negative pulse detection signal NPD1 is input to the pulse widening circuit PWC2. The pulse widening circuits PWC1 and PWC2 widen the positive pulse detection signal PPD1 and the negative pulse detection signal NPD1, respectively, and output a positive pulse detection signal PPD2 and a negative pulse detection signal NPD2. The pulse widening circuits PWC1 and PWC2 delay only the falling edge of the positive pulse detection signal PPD1 and the negative pulse detection signal NPD1 without changing the rising edge of them. The H level period of the positive pulse detection signal PPD2 and the H level period of the negative pulse detection signal NPD2 thereby partly overlap.

The positive pulse detection signal PPD2 and the negative pulse detection signal NPD2 are input to the sequential logic circuit SLC. The sequential logic circuit SLC determines the sequence of the input positive pulse detection signal PPD2 and the input negative pulse detection signal NPD2 and outputs an output data signal Dout1. Specifically, when the positive pulse detection signal PPD2 is input first, the sequential logic circuit SLC outputs H level as the output data signal Dout1. On the other hand, when the negative pulse detection signal NPD2 is input first, the sequential logic circuit SLC outputs L level as the output data signal Dout1.

Further, the positive pulse detection signal PPD2 and the negative pulse detection signal NPD2 are input to the OR gate OR2. The OR gate OR2 outputs a pulse detection signal PD1. The pulse detection signal PD1 can be used as a reset signal of a timer that measures a time from the output of the pulse detection signal PD1, for example, as described later in the third embodiment. Note that, as is obvious from FIG. 5, the OR gate OR2 is not essential in generating the output data signal Dout1.

Figure 6:
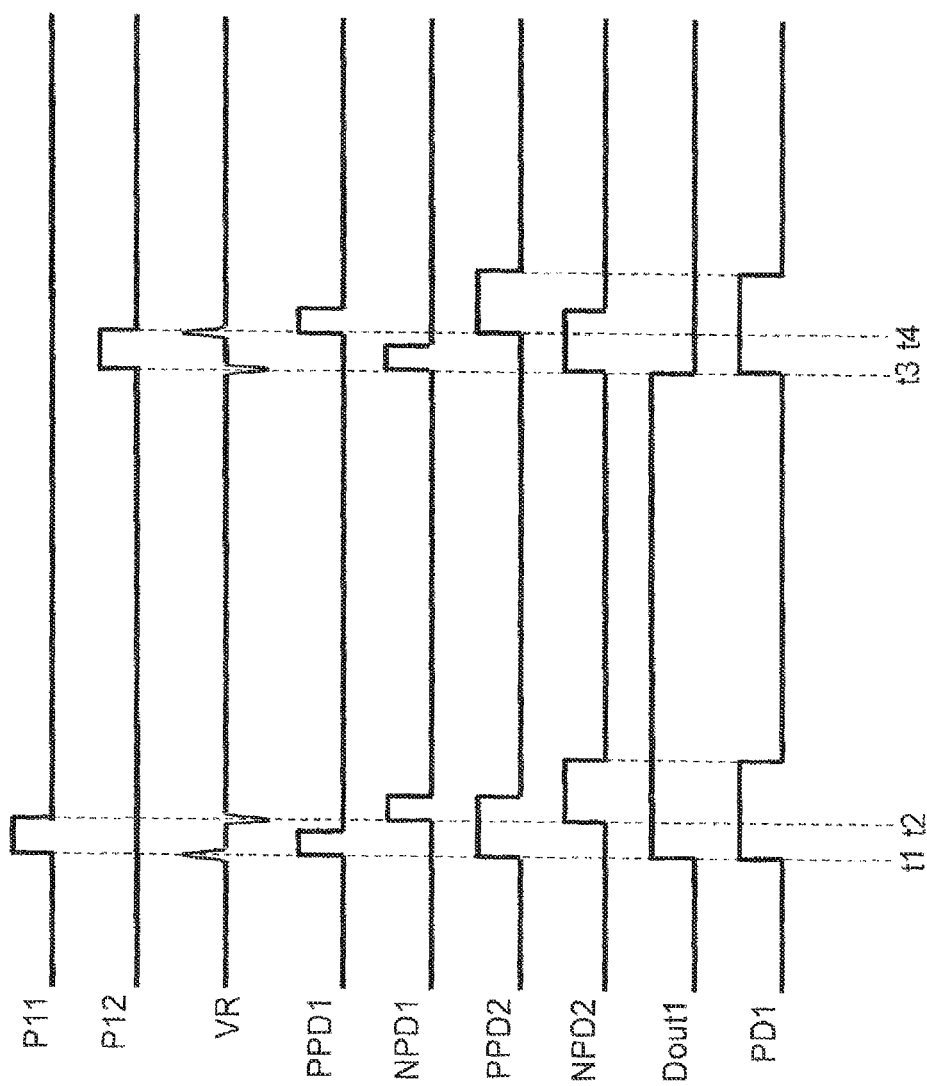
FIG. 6 is a timing chart showing an example of an operation of the receiving circuit RX1 according to the first embodiment.

The operation of the receiving circuit RX1 is described hereinafter with reference to FIG. 6. FIG. 6 is a timing chart showing an example of the operation of the receiving circuit RX1 according to the first embodiment. In FIG. 6, the transmission pulse signal P11 and the transmission pulse signal P12 output from the transmitting circuit TX1, the reception signal VR of the secondary coil L12, the positive pulse detection signal PPD1, the negative pulse detection signal NPD1, the positive pulse detection signal PPD2, the negative pulse detection signal NPD2, the output data signal Dout1 and the pulse detection signal PD1 are shown from above.

In the reception signal VR of the secondary coil L12 shown in the third row, a positive pulse that projects upward from the graph or a negative pulse that projects downward from the graph occurs in accordance with the transmission pulse signal P11 shown in the uppermost row and the transmission pulse signal P12 shown in the second row. Specifically, at the rising edge of the transmission pulse signal P11 and the falling edge of the transmission pulse signal P12, a positive pulse occurs. On the other hand, at the falling edge of the transmission pulse signal P11 and the rising edge of the transmission pulse signal P12, a negative pulse occurs.

The positive pulse detection signal PPD1 shown in the fourth row is output at the timing when the positive pulse of the reception signal VR is generated.

The negative pulse detection signal NPD1 shown in the fifth row is output at the timing when the negative pulse of the reception signal VR is generated.

The positive pulse detection signal PPD2 shown in the sixth row is a signal widened by delaying the falling edge of the positive pulse detection signal PPD1 in the pulse widening circuit PWC1.

The negative pulse detection signal NPD2 shown in the seventh row is a signal widened by delaying the falling edge of the negative pulse detection signal NPD1 in the pulse widening circuit PWC2.

The pulse detection signal PD1 shown in the ninth row is a signal that is output each time the transmission pulse signal P11 or the transmission pulse signal P12 is output. As described above, it is generated from the positive pulse detection signal PPD2 and the negative pulse detection signal NPD2.

The operation is described in time series.

At time t1, the transmission pulse signal P11 changes from L level to H level, and therefore a positive pulse occurs in the reception signal VR. Accordingly, at time t1, the positive pulse detection signals PPD1 and PPD2 change from L level to H level. As a result that the positive pulse detection signal PPD2 changes from L level to H level, H level is output as the output data signal Dout1.

At time t2, the transmission pulse signal P11 changes from H level to L level, and therefore a negative pulse occurs in the reception signal VR. Accordingly, at time t2, the negative pulse detection signals NPD1 and NPD2 change from L level to H level. Thus, at time t2, the negative pulse detection signal NPD2 changes from L level to H level, but the positive pulse detection signal PPD2 remains at H level. Therefore, L level is not output as the output data signal Dout1, and H level is maintained. Thus, the output data signal Dout1 does not change even when the negative pulse detection signal NPD2 transitions from L level to H level in the state where the positive pulse detection signal PPD2 is H level.

At time t3, the transmission pulse signal P12 changes from L level to H level, and therefore a negative pulse occurs in the reception signal VR. Accordingly, at time t3, the negative pulse detection signals NPD1 and NPD2 change from L level to H level. As a result that the negative pulse detection signal NPD2 changes from L level to H level, L level is output as the output data signal Dout1.

At time t4, the transmission pulse signal P12 changes from H level to L level, and therefore a positive pulse occurs in the reception signal VR. Accordingly, at time t4, the positive pulse detection signals PPD1 and PPD2 change from L level to H level. Thus, at time t4, the positive pulse detection signal PPD2 changes from L level to H level, but the negative pulse detection signal NPD2 remains at H level. Therefore, H level is not output as the output data signal Dout1, and L level is maintained. Thus, the output data signal Dout1 does not change even when the positive pulse detection signal PPD2 transitions from L level to H level in the state where the negative pulse detection signal NPD2 is H level.

Figure 7:
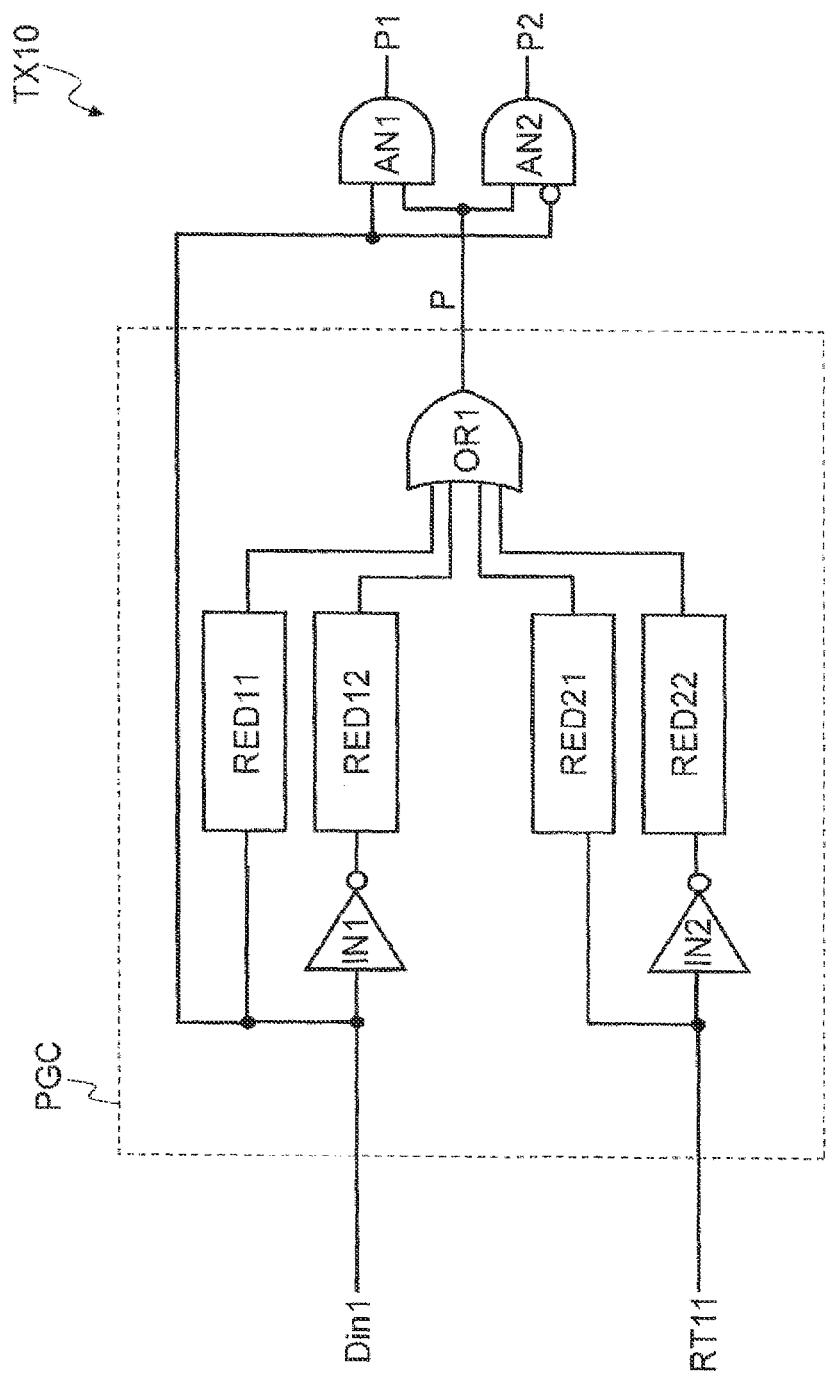
FIG. 7 is a circuit diagram showing an example of a specific circuit configuration of a transmitting circuit TX10 according to a comparative example of the first embodiment.

Hereinafter, a transmitting circuit TX10 according to a comparative example of the first embodiment is described with reference to FIG. 7. FIG. 7 is a circuit diagram showing an example of a specific circuit configuration of the transmitting circuit TX10 according to the comparative example of the first embodiment. As shown in FIG. 7, the transmitting circuit TX10 is also composed of a pulse generation circuit PGC and two AND gates AN1 and AN2. The pulse generation circuit PGC includes two inverters IN1 and IN2, four rising edge detection circuit RED11, RED12, RED21 and RED22, and one OR gate OR1. Thus, compared with the transmitting circuit TX1 according to the first embodiment shown in FIG. 3, the transmitting circuit TX10 does not include three delay circuits DC11, DC12 and DC21 and one XOR gate XO1.

Connections are as follows.

In the transmitting circuit TX10 according to the alternative example, the input data signal Din1 is transmitted to the receiving circuit as it is and restored as a data signal.

Therefore, the input data signal Din1 is input directly to the rising edge detection circuit RED11. The rising edge detection circuit RED11 outputs an edge detection signal at the rising edge of the input data signal Din1.

Further, an inverted signal of the input data signal Din1 through the inverter IN1 is input to the rising edge detection circuit RED12. The rising edge detection circuit RED12 outputs an edge detection signal at the rising edge of the inverted signal of the input data signal Din1, which is the falling edge of the input data signal Din1.

The retransmission request signal RT11 is input to the rising edge detection circuit RED21. The rising edge detection circuit RED21 outputs an edge detection signal at the rising edge of the retransmission request signal RT11.

Further, an inverted signal of the retransmission request signal RT11 through the inverter IN2 is input to the rising edge detection circuit RED22. The rising edge detection circuit RED22 outputs an edge detection signal at the rising edge of the inverted signal of the retransmission request signal RT11, which is the falling edge of the retransmission request signal RT11.

The edge detection signals that are output from the four rising edge detection circuits RED11, RED12, RED21 and RED22 are input to the OR gate OR1. The OR gate OR1 outputs a total pulse signal P.

The total pulse signal P is input to the two AND gates AN1 and AN2. Further, the input data signal Din1 is input to the AND gate AN1. On the other hand, an inverted signal of the input data signal Din1 is input to the AND gate AN2.

As a result, the AND gate AN1 outputs a transmission pulse signal P1 that transmits H level at the timing when the total pulse signal P becomes active (H level). Further, the AND gate AN2 outputs a transmission pulse signal P2 that transmits L level at the timing when the total pulse signal P becomes active.

As described above, the transmitting circuit TX10 according to the comparative example does not include the delay circuits DC11, DC12 and DC21 and the XOR gate XO1, which are included in the transmitting circuit TX1 according to this embodiment. Therefore, when the edge of the input data signal Din1 and the edge of the retransmission request signal RT11 are too close, the occurrence of the transmission pulse signals P1 and P2 in response to the retransmission request signal RT11 cannot be prohibited. There is thus a possibility that the data signal is wrongly restored in the receiving circuit.

Figure 8:
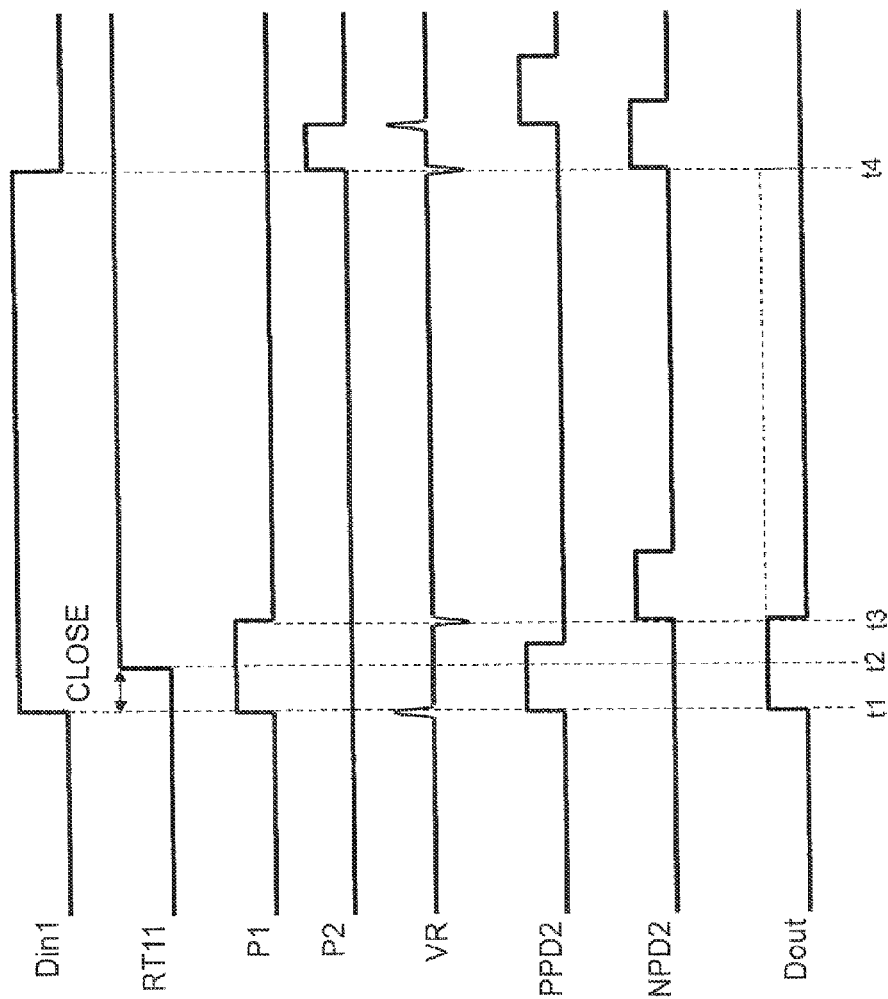
FIG. 8 is a timing chart to describe an example where a data signal is wrongly restored in a receiving circuit.
Figure 9:
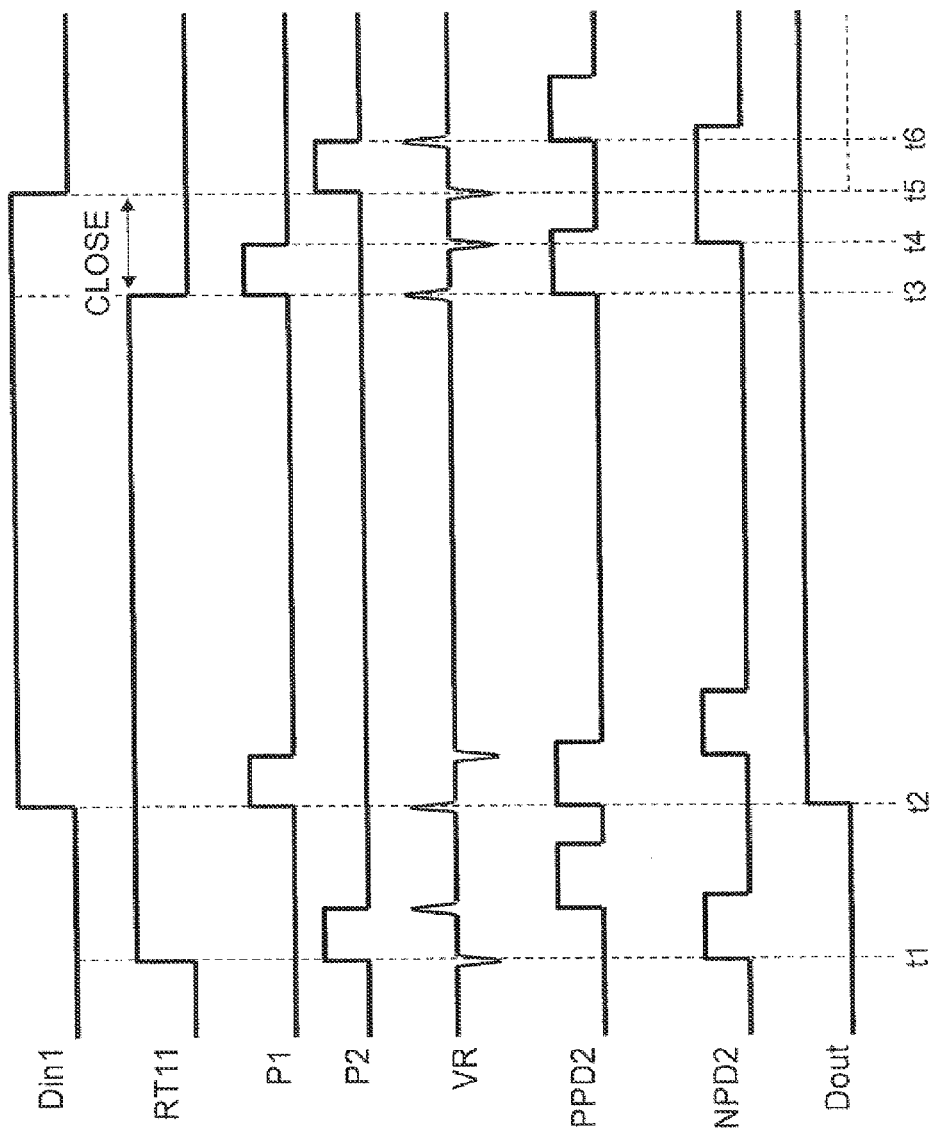
FIG. 9 is a timing chart to describe an example where a data signal is wrongly restored in a receiving circuit.

An example where the data signal is wrongly restored in the receiving circuit in the case of using the transmitting circuit TX10 according to the comparative example is described with reference to FIGS. 8 and 9. The configuration of the receiving circuit is the same as shown in FIG. 5. FIGS. 8 and 9 are timing charts to describe an example where the data signal is wrongly restored in the receiving circuit. Note that they are just examples, and there is a case where the data signal is wrongly restored due to a different mechanism.

In FIGS. 8 and 9, the input data signal Din1, the retransmission request signal RT11, the transmission pulse signal P1, the transmission pulse signal P2, the reception signal VR of the secondary coil L12, the positive pulse detection signal PPD2, the negative pulse detection signal NPD2 and the output data signal Dout1 are shown from the above.

FIG. 8 is described first.

At time t1, the input data signal Din1 changes from L level to H level. Therefore, the transmission pulse signal P1 also changes from L level to H level, and a positive pulse occurs in the reception signal VR. Accordingly, at time t1, the positive pulse detection signal PPD2 changes from L level to H level. As a result, H level is output as the output data signal Dout1.

At time t2, the retransmission request signal RT11 changes from L level to H level. Because the input data signal Din1 is H level, the transmission pulse signal P1 is output. The rising edge of the input data signal Din1 at time t1 and the rising edge of the retransmission request signal RT11 at time t2 are close. Therefore, the transmission pulse signal P1 output at time t1 and the transmission pulse signal P1 output at time t2 are combined into one pulse signal. Consequently, a positive pulse does not occur in the reception signal VR, and the value of the input data signal Din1 is not transmitted.

At time t3, the transmission pulse signal P1 changes from H level to L level, and therefore a negative pulse occurs in the reception signal VR. Therefore, at time t3, the negative pulse detection signal NPD2 changes from L level to H level. The positive pulse detection signal PPD2 that has risen at time t1 has already transitioned to L level at time t3. Accordingly, L level is wrongly output as the output data signal Dout1. In this manner, as a result that the two transmission pulse signals P1 (or P2) are combined together, the data signal can be wrongly restored.

Note that, at time t4, the input data signal Din1 changes from H level to L level, and L level is correctly output as the output data signal Dout1, and therefore detailed description thereof is omitted.

FIG. 9 is described next.

First, at time t1, the retransmission request signal RT11 changes from L level to H level, and the value (L level) of the input data signal Din1 is transmitted correctly as the output data signal Dout1. Further, at time t2, the input data signal Din1 changes from L level to H level, and H level is correctly output as the output data signal Dout1. Therefore, detailed description thereof is omitted.

At time t3, the retransmission request signal RT11 changes from H level to L level. Because the input data signal Din1 is H level, the transmission pulse signal P1 is output. Therefore, the transmission pulse signal P1 also changes from L level to H level, and a positive pulse occurs in the reception signal VR. Accordingly, at time t3, the positive pulse detection signal PPD2 changes from L level to H level. As a result, H level is transmitted as the output data signal Dout1.

At time t4, the transmission pulse signal P1 changes from H level to L level, and therefore a negative pulse occurs in the reception signal VR. Accordingly, at time t4, the negative pulse detection signal NPD2 changes from L level to H level. However, because the positive pulse detection signal PPD2 remains at H level as described above, L level is not output as the output data signal Dout1.

At time t5, the input data signal Din1 changes from H level to L level. Therefore, the transmission pulse signal P2 also changes from L level to H level, and a negative pulse occurs in the reception signal VR. Accordingly, the negative pulse detection signal NPD2 is output. At this time, the negative pulse detection signal NPD2 output at time t4 and the negative pulse detection signal NPD2 output at time t5 are combined into one pulse signal. Thus, at time t5, the negative pulse detection signal NPD2 does not transition from L level to H level, and L level is not output as the output data signal Dout1, and the output data signal Dout1 is wrongly maintained at H level. In this manner, as a result that the two negative pulse detection signals NPD2 (or positive pulse detection signals PPD2) are combined together, the data signal can be wrongly restored.

Note that, at time t6, the transmission pulse signal P2 changes from H level to L level, and a positive pulse occurs in the reception signal VR. Therefore, at time t6, the positive pulse detection signal PPD2 changes from L level to H level. However, because the negative pulse detection signal NPD2 remains at H level as described above, L level is not output as the output data signal Dout1.

As described above, in the semiconductor device 1 according to this embodiment, the transmitting circuit TX1 generates the delayed data signal DD1 and the delayed retransmission request signal DRT11 by delaying the input data signal Din1 and the retransmission request signal RT11, respectively, and prohibits the generation of the transmission pulse signals P11 and P12 at the edge of the delayed retransmission request signal DRT11 during a specified period of time across the edge of the delayed data signal DD1. It is thereby possible to prevent the data signal from being wrongly restored in the receiving circuit RX1.

Second Embodiment

Figure 10:
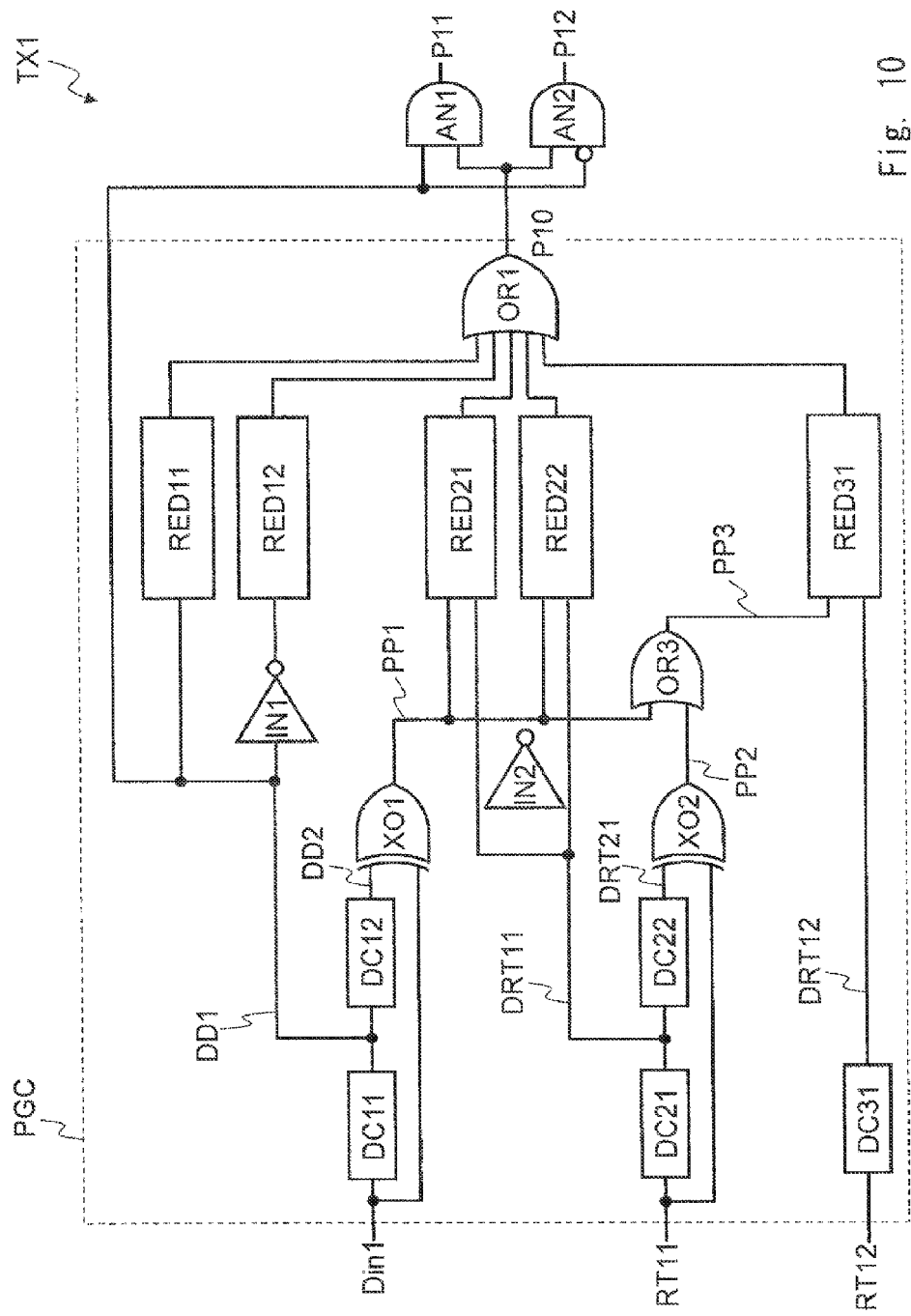
FIG. 10 is a circuit diagram showing an example of a specific circuit configuration of a transmitting circuit TX1 according to a second embodiment.

A transmitting circuit TX1 according to a second embodiment is described hereinafter with reference to FIG. 10. FIG. 10 is a circuit diagram showing an example of a specific circuit configuration of the transmitting circuit TX1 according to the second embodiment. Note that, as shown in FIG. 10, the transmitting circuit TX1 is composed of a pulse generation circuit PGC and two AND gates AN1 and AN2. The pulse generation circuit PGC includes five delay circuits DC11, DC12, DC21, DC22 and DC31, two XOR gates XO1 and XO2, two inverters IN1 and IN2, five rising edge detection circuits RED11, RED12, RED21, RED22 and RED31, and two OR gates OR1 and OR3.

As shown in FIG. 10, a retransmission request signal RT12 is input to the transmitting circuit TX1, in addition to the input data signal Din1 and the retransmission request signal RT11. For example, the retransmission request signal RT11 may be output irregularly in response to a specific event, and the retransmission request signal RT12 may be output regularly.

The transmitting circuit TX1 further includes delay circuits DC22 and DC31, an XOR gate XO2, an OR gate OR3 and a rising edge detection circuit RED31, in addition to the circuit configuration of the transmitting circuit TX1 according to the first embodiment.

Connections are as follows.

The input data signal Din1 is input to the delay circuit DC11. The delay circuit DC11 outputs the delayed data signal DD1 (first delayed signal) that is generated by delaying the input data signal Din1 by a delay time Td. The delayed data signal DD1, not the input data signal Din1, is transmitted to the receiving circuit and restored as a data signal.

Thus, the delayed data signal DD1 is input to the rising edge detection circuit RED11. The rising edge detection circuit RED11 outputs an edge detection signal at the rising edge of the delayed data signal DD1.

Further, an inverted signal of the delayed data signal DD1 through the inverter IN1 is input to the rising edge detection circuit RED12. The rising edge detection circuit RED12 outputs an edge detection signal at the rising edge of the inverted signal of the delayed data signal DD1, which is the falling edge of the delayed data signal DD1.

Further, the delayed data signal DD1 is input to the delay circuit DC12. The delay circuit DC12 outputs a delayed data signal DD2 generated by further delaying the delayed data signal DD1 by a delay time Td.

The input data signal Din1 and the delayed data signal DD2 are input to the XOR gate XO1. The XOR gate XO1 outputs a prohibited period signal PP1 indicating a period of 2 Td from the edge of the input data signal Din1 to the edge of the delayed data signal DD2. As described in detail later, the prohibited period signal PP1 is a signal for prohibiting the edge detection of the delayed retransmission request signals DRT11 and DRT12 generated by delaying the retransmission request signals RT11 and RT12, which are described later, by a delay time Td during a period of Td before and after the edge of the delayed data signal DD1 (total 2 Td).

The retransmission request signal RT11 is input to the delay circuit DC21. The delay circuit DC21 outputs the delayed retransmission request signal DRT11 generated by delaying the retransmission request signal RT11 by a delay time Td. The value of the delayed data signal DD1 is retransmitted at the edge of the delayed retransmission request signal DRT11, not the retransmission request signal RT11.

Thus, the delayed retransmission request signal DRT11 is input to the rising edge detection circuit RED21. The rising edge detection circuit RED21 outputs an edge detection signal at the rising edge of the delayed retransmission request signal DRT11. The prohibited period signal PP1 is also input to the rising edge detection circuit RED21. Therefore, the rising edge detection circuit RED21 does not output the edge detection signal when the rising edge of the delayed retransmission request signal DRT11 is in the retransmission prohibited period (the period that is Td before and after the edge of the delayed data signal DD1).

Further, an inverted signal of the delayed retransmission request signal DRT11 through the inverter IN2 is input to the rising edge detection circuit RED22. The rising edge detection circuit RED22 outputs an edge detection signal at the rising edge of the inverted signal of the delayed retransmission request signal DRT11, which is the falling edge of the delayed retransmission request signal DRT11. The prohibited period signal PP1 is also input to the rising edge detection circuit RED22. Therefore, the rising edge detection circuit RED22 also does not output the edge detection signal when the falling edge of the delayed retransmission request signal DRT11 is in the retransmission prohibited period (the period that is Td before and after the edge of the delayed data signal DD1).

Further, the delayed retransmission request signal DRT11 is input to the delay circuit DC22. The delay circuit DC22 outputs a delayed retransmission request signal DRT21 generated by further delaying the delayed retransmission request signal DRT11 by a delay time Td.

The retransmission request signal RT11 and the delayed retransmission request signal DRT21 are input to the XOR gate XO2. The XOR gate XO2 outputs a prohibited period signal PP2 indicating a period of 2 Td from the edge of the retransmission request signal RT11 to the edge of the delayed retransmission request signal DRT21. As described in detail later, the prohibited period signal PP2 is a signal for prohibiting the edge detection of the delayed retransmission request signal DRT12 generated by delaying the retransmission request signal RT12, which is described later, by a delay time Td during a period of Td before and after the edge of the retransmission request signal RT11 (total 2 Td).

The prohibited period signals PP1 and PP2 are input to the OR gate OR3. The OR gate OR3 outputs a prohibited period signal PP3.

The retransmission request signal RT12 is input to the delay circuit DC31. The delay circuit DC31 outputs the delayed retransmission request signal DRT12 generated by delaying the retransmission request signal RT12 by a delay time Td. The value of the delayed data signal DD1 is retransmitted at the edge of the delayed retransmission request signal DRT12, not the retransmission request signal RT12.

Thus, the delayed retransmission request signal DRT12 is input to the rising edge detection circuit RED31. The rising edge detection circuit RED31 outputs an edge detection signal at the rising edge of the delayed retransmission request signal DRT12. The prohibited period signal PP3 is also input to the rising edge detection circuit RED31. Therefore, the rising edge detection circuit RED31 does not output the edge detection signal when the rising edge of the delayed retransmission request signal DRT12 is in the retransmission prohibited period (the period that is Td before and after the edge of the delayed data signal DD1 and the delayed retransmission request signal DRT11).

The edge detection signals that are output from the five rising edge detection circuits RED11, RED12, RED21, RED22 and RED31 are input to the OR gate OR1. The OR gate OR1 outputs a total pulse signal P10.

The total pulse signal P10 is input to the two AND gates AN1 and AN2. Further, the delayed data signal DD1 is input to the AND gate AN1. On the other hand, an inverted signal of the delayed data signal DD1 is input to the AND gate AN2.

As a result, the AND gate AN1 outputs the transmission pulse signal P11 that transmits H level at the timing when the total pulse signal P10 becomes active (H level). Further, the AND gate AN2 outputs the transmission pulse signal P12 that transmits L level at the timing when the total pulse signal P10 becomes active.

Figure 11:
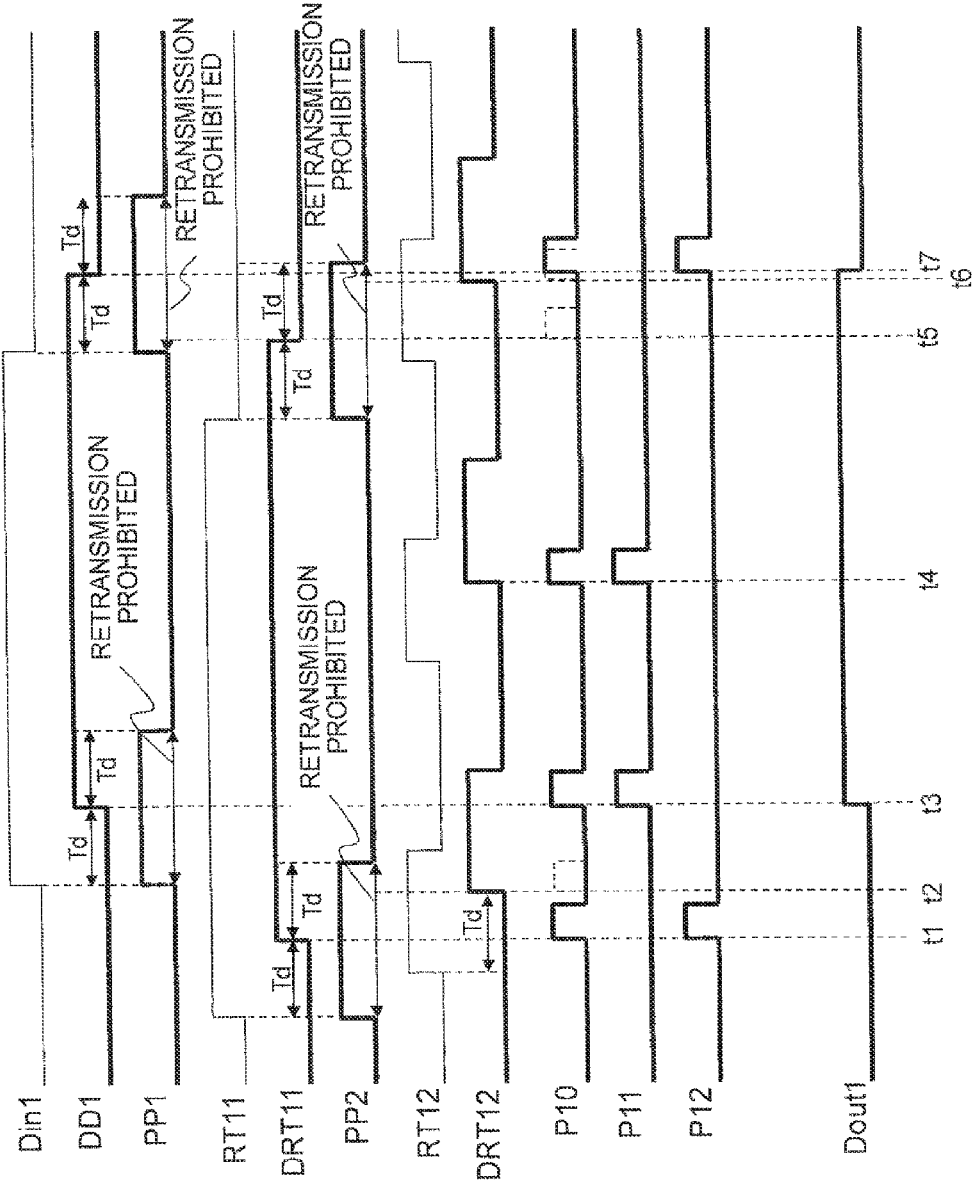
FIG. 11 is a timing chart showing an example of an operation of the transmitting circuit TX1 according to the second embodiment.

The operation of the transmitting circuit TX1 is described hereinafter with reference to FIG. 11. FIG. 11 is a timing chart showing an example of the operation of the transmitting circuit TX1 according to the second embodiment.

In FIG. 11, the input data signal Din1, the delayed data signal DD1, the prohibited period signal PP1, the retransmission request signal RT11, the delayed retransmission request signal DRT11, the prohibited period signal PP2, the retransmission request signal RT12, the delayed retransmission request signal DRT12, the total pulse signal P10, the transmission pulse signal P11, the transmission pulse signal P12 and the output data signal Dout1 are shown from above.

The delayed data signal DD1 shown in the second row is a signal generated by delaying the input data signal Din1 shown in the uppermost row by a delay time Td. As described above, the delayed data signal DD1 is restored as the output data signal Dout1 shown in the lowermost row.

The prohibited period signal PP1 shown in the third row is a period signal for prohibiting the edge detection of the delayed retransmission request signal DRT11 shown in the fifth row and the delayed retransmission request signal DRT12 shown in the eighth row during a period of Td before and after the edge of the delayed data signal DD1.

The delayed retransmission request signal DRT11 shown in the fifth row is a signal generated by delaying the retransmission request signal RT11 shown in the fourth row by a delay time Td. As described above, the value of the delayed data signal DD1 is retransmitted at the edge of the delayed retransmission request signal DRT11.

The prohibited period signal PP2 shown in the sixth row is a period signal for prohibiting the edge detection of the delayed retransmission request signal DRT12 shown in the eighth row during a period of Td before and after the edge of the delayed retransmission request signal DRT11.

The operation is described in time series.

At time t1, the delayed retransmission request signal DRT11 changes from L level to H level, and therefore the total pulse signal P10 is output. Further, at time t1, the delayed data signal DD1 is L level, and therefore the transmission pulse signal P12 that transmits L level is output. As a result, L level is transmitted as the output data signal Dout1. Thus, the signal level of the output data signal Dout1 is maintained. Note that the period of Td before and after time t1, which is the rising edge of the delayed retransmission request signal DRT11, is the retransmission prohibited period by the delayed retransmission request signal DRT12.

At time t2, the delayed retransmission request signal DRT12 changes from L level to H level; however, it is during the retransmission prohibited period near the edge of the delayed retransmission request signal DRT11. Thus, the total pulse signal P10 is not output.

At time t3, the delayed data signal DD1 changes from L level to H level, and therefore the total pulse signal P10 is output. Then, the transmission pulse signal P11 that transmits H level is output. As a result, H level is transmitted as the output data signal Dout1. Thus, the signal level of the output data signal Dout1 changes from L level to H level. Note that the period that is Td before and after time t3, which is the rising edge of the delayed data signal DD1, is the retransmission prohibited period by the delayed retransmission request signals DRT11 and DRT12.

At time t4, the delayed retransmission request signal DRT12 changes from L level to H level, and therefore the total pulse signal P10 is output. Further, at time t4, the delayed data signal DD1 is H level, and therefore the transmission pulse signal P11 that transmits H level is output. As a result, H level is transmitted as the output data signal Dout1. Thus, the signal level of the output data signal Dout1 is maintained.

At time t5, the delayed retransmission request signal DRT11 changes from H level to L level; however, it is during the retransmission prohibited period near the edge of the delayed data signal DD1, and therefore the total pulse signal P10 is not output.

At time t6, the delayed retransmission request signal DRT12 changes from L level to H level; however, it is during the retransmission prohibited period near the edge of the delayed data signal DD1, and therefore the total pulse signal P10 is not output. Note that time t6 is also the retransmission prohibited period near the edge of the delayed retransmission request signal DRT11.

At time t7, the delayed data signal DD1 changes from H level to L level, and therefore the total pulse signal P10 is output. Then, the transmission pulse signal P12 that transmits L level is output. As a result, L level is transmitted as the output data signal Dout1. Thus, the signal level of the output data signal Dout1 changes from H level to L level.

In this manner, near the edge of a signal with a higher priority, the output of a transmission pulse signal corresponding to the edge of a signal with a lower priority is prohibited. It is thereby possible to prevent that the data signal is wrongly restored in the receiving circuit RX1. Note that, because the retransmission request signal is a signal for transmitting a data signal, the priority of the data signal is the highest, and the priorities of the retransmission request signals may be determined as appropriate.

Third Embodiment

Figure 12:
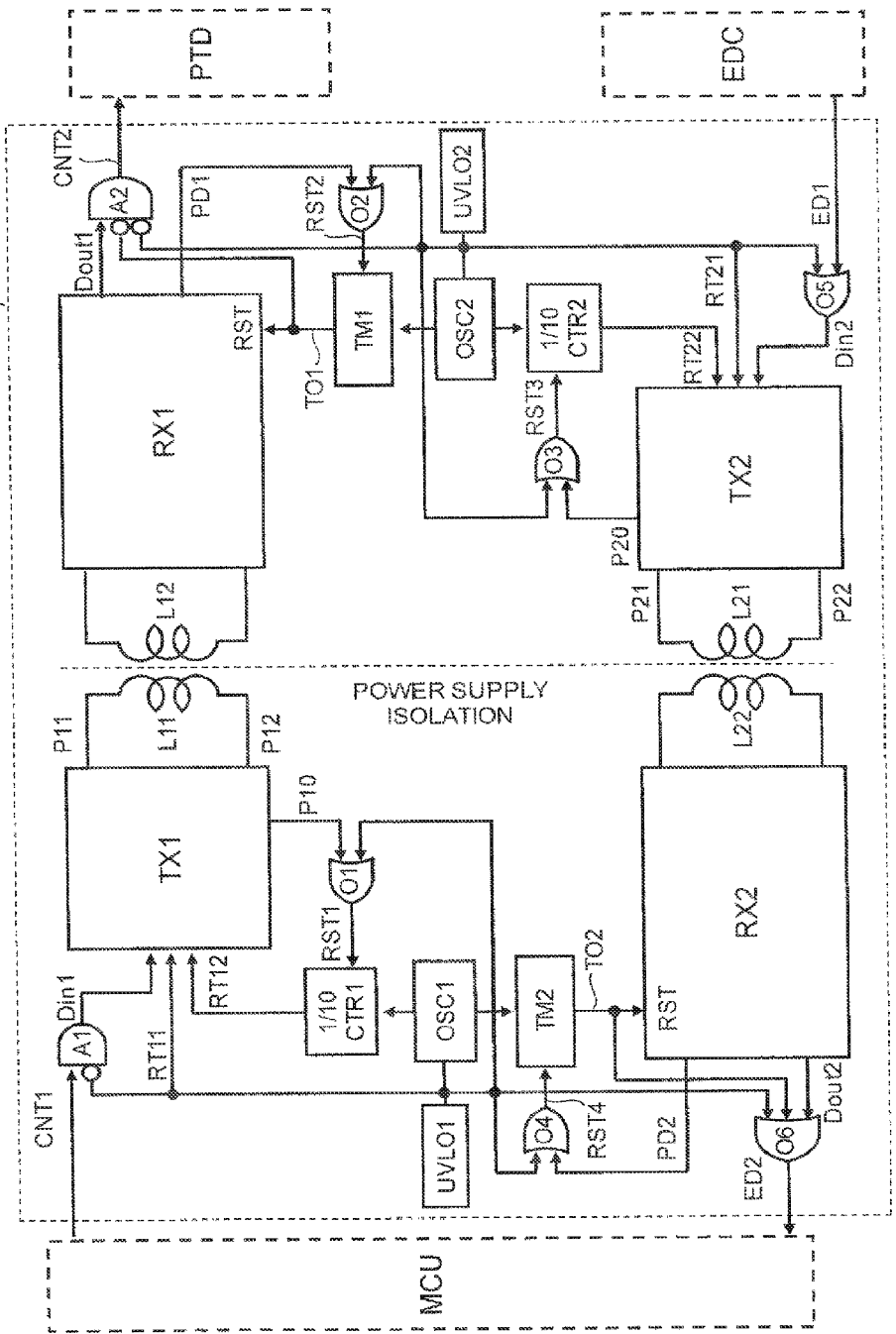
FIG. 12 is a block diagram showing a configuration of a semiconductor device 2 according to a third embodiment.

A semiconductor device 2 according to a third embodiment is described hereinafter with reference to FIG. 12. FIG. 12 is a block diagram showing a configuration of the semiconductor device 2 according to the third embodiment. The semiconductor device 2 according to the third embodiment includes two transmitting circuits TX1 and TX2, primary coils L11 and L21, secondary coils L12 and L22, two receiving circuits RX1 and RX2, two oscillation circuits OSC1 and OSC2, two 1/10 counters CTR1 and CTR2, two timers TM1 and TM2, two under voltage lock out (UVLO) circuits UVLO1 and UVLO2, two AND gates A1 and A2, and six OR gates O1 to O6.

The transmitting circuits TX1 and TX2 have the same configuration as the transmitting circuit TX1 described in the second embodiment with reference to FIG. 10. Further, the receiving circuits RX1 and RX2 have the same configuration as the receiving circuit RX1 described in the first embodiment with reference to FIG. 5. The semiconductor device 2 according to the third embodiment is an example of an isolator that is applied to a control system of a power transistor.

The main elements and the flow of signals are described first.

A control signal CNT1 that is output from a microcomputer MCU is input as an input data signal Din1 to the transmitting circuit TX1. Further, retransmission request signals RT11 and RT12 are also input to the transmitting circuit TX1.

The transmitting circuit TX1 outputs transmission pulse signals P11 and P12 corresponding to the edge of signals generated by delaying the input data signal Din1 and the retransmission request signals RT11 and RT12 by the same delay time, as described in the second embodiment. Specifically, when the edge of a signal with a lower priority becomes close to the edge of a signal with a higher priority, only the transmission pulse signal corresponding to the edge of the signal with a higher priority is generated, and the transmission pulse signal corresponding to the edge of the signal with a lower priority is not generated.

The transmission pulse signals P11 and P12 that are output from the transmitting circuit TX1 are transmitted to the receiving circuit RX1 through the primary coil L11 and the secondary coil L12. The receiving circuit RX1 restores the data signal from the received signals and outputs an output data signal Dout1. The output data signal Dout1 is input as a control signal CNT2 to a power transistor driver PTD.

Thus, the control signal CNT1 that is output from the microcomputer MCU is input as the control signal CNT2 to a power transistor driver PTD through the transmitting circuit TX1 and the receiving circuit RX1.

On the other hand, an error detection signal ED 1 that is output from an error detection circuit EDC is input as an input data signal Din2 to the transmitting circuit TX2. Further, retransmission request signals RT21 and RT22 are also input to the transmitting circuit TX2.

The transmitting circuit TX2 also outputs transmission pulse signals P21 and P22 corresponding to the edge of signals generated by delaying the input data signal Din2 and the retransmission request signals RT21 and RT22 by the same delay time, as described in the second embodiment. Specifically, when the edge of a signal with a lower priority becomes close to the edge of a signal with a higher priority, only the transmission pulse signal corresponding to the edge of the signal with a higher priority is generated, and the transmission pulse signal corresponding to the edge of the signal with a lower priority is not generated.

The transmission pulse signals P21 and P22 that are output from the transmitting circuit TX2 are transmitted to the receiving circuit RX2 through the primary coil L21 and the secondary coil L22. The receiving circuit RX2 restores the data signal from the received signals and outputs an output data signal Dout2. The output data signal Dout2 is input as an error detection signal ED2 to the microcomputer MCU.

Thus, the error detection signal ED1 that is output from the error detection circuit EDC is input as the error detection signal ED2 to the microcomputer MCU through the transmitting circuit TX2 and the receiving circuit RX2.

The detailed elements and the flow of signals are described below.

The control signal CNT1 that is output from the microcomputer MCU is input as the input data signal Din1 to the transmitting circuit TX1 through the AND gate A1. An inverted signal of the retransmission request signal RT11 that is output from the UVLO circuit UVLO1 is also input to the AND gate A1. The retransmission request signal RT11 is input also to the transmitting circuit TX1.

The retransmission request signal RT11 is L level in normal times and becomes H level in an abnormal time when a power supply voltage drops. Thus, in normal times when the retransmission request signal RT11 is L level, the control signal CNT1 that is output from the microcomputer MCU is input as the input data signal Din1 to the transmitting circuit TX1. On the other hand, in an abnormal time when the retransmission request signal RT11 is H level, the input of the control signal CNT1 output from the microcomputer MCU to the transmitting circuit TX1 is blocked by the AND gate A1.

Further, as described in the first and second embodiments, at the timing when the retransmission request signal RT11 transitions from L level to H level or from H level to L level, the value of the input data signal Din1 (control signal CNT1) is retransmitted from the transmitting circuit TX1 to the receiving circuit RX1. In other words, the value of the data signal at the transmitting end and the value of the data signal at the receiving end are synchronized not only when the power supply voltage drops but also at the timing when the power supply voltage rises after power-on and changes to a normal value.

Further, the retransmission request signal RT12 that is output from the 1/10 counter CTR1 is input to the transmitting circuit TX1. The retransmission request signal RT12 is a signal that becomes H level at the rate of once in ten times of the clock signal output from the oscillation circuit OSC1. For example, when a clock signal of 10 MHz is output from the oscillation circuit OSC1, the retransmission request signal RT12 with a period of 1 μs (1 MHz) is generated in the 1/10 counter CTR1. By the retransmission request signal RT12, a data value is retransmitted at the rate of once in ten counts even when there is no change in a data value. Therefore, even when a data value that is restored in the receiving circuit RX1 is inverted due to noise or the like, the value can be promptly returned to the correct value.

Further, the 1/10 counter CTR1 is reset by the total pulse signal P10 or the retransmission request signal RT11 that is output from the UVLO circuit UVLO1. Specifically, the 1/10 counter CTR1 is reset by a reset signal RST1 that is output from the OR gate O1 to which the total pulse signal P10 and the retransmission request signal RT11 are input.

The transmitting circuit TX1 outputs the transmission pulse signals P11 and P12 based on the input data signal Din1 and the retransmission request signals RT11 and RT12. The retransmission request signals RT11 and RT12 are input to the receiving circuit RX1 through the primary coils L11 and L21. The receiving circuit RX1 restores the data signal and outputs it as the output data signal Dout1. Note that the details are as described in the first and second embodiments.

The output data signal Dout1 is input to the power transistor driver PTD through the AND gate A2. An inverted signal of the retransmission request signal RT21 that is output from the UVLO circuit UVLO2 is input to the AND gate A2. Further, an inverted signal of a timeout signal TO1 that is output from the timer TM1 is input to the AND gate A2.

The retransmission request signal RT21 is L level in normal times and becomes H level when a power supply voltage drops. The timeout signal TO1 is also L level in normal times and becomes H level when the pulse detection signal PD1 is not detected until a specified count (for example, 40 counts). Thus, in normal times when the retransmission request signal RT21 and the timeout signal TO1 are L level, the output data signal Dout1 is input to the power transistor driver PTD. On the other hand, when the retransmission request signal RT21 or the timeout signal TO1 changes to H level, the input of the output data signal Dout1 to the power transistor driver PTD is blocked by the AND gate A2. Further, the timeout signal TO1 resets the receiving circuit RX1. Note that, in normal operation, a data value is retransmitted once in ten counts from the transmitting circuit TX1 by the retransmission request signal RT12, and the pulse detection signal PD1 is output from the receiving circuit RX1. Therefore, the timer TM1 does not reach 40 counts. On the other hand, when the transmitting circuit TX1 stops, for example, the timeout signal TO1 is output. The abnormal operation of the transmitting circuit TX1 can be detected by the retransmission request signal RT12.

The timer TM1 counts the clock signal that is output from the oscillation circuit OSC2. Further, the timer TM1 is reset by the pulse detection signal PD1 that is output from the receiving circuit RX1 or the retransmission request signal RT21 that is output from the UVLO circuit UVLO2. Specifically, the timer TM1 is reset by a reset signal RST2 that is output from the OR gate O2 to which the pulse detection signal PD1 and the retransmission request signal RT21 are input.

On the other hand, the error detection signal ED1 that is output from the error detection circuit EDC is input as the input data signal Din2 to the transmitting circuit TX2 through the OR gate O5. The error detection signal ED1 is L level in normal times and becomes H level in an abnormal time when some error is detected. The retransmission request signal RT21 that is output from the UVLO circuit UVLO2 is also input to the OR gate O5. The retransmission request signal RT21 is L level in normal times and becomes H level in an abnormal time when a power supply voltage drops. Thus, the retransmission request signal RT21 is input also as an error signal, together with the error detection signal ED1, to the transmitting circuit TX2.

Further, as described in the first and second embodiments, at the timing when the retransmission request signal RT21 transitions from L level to H level or from H level to L level, the value of the input data signal Din2 is retransmitted from the transmitting circuit TX2 to the receiving circuit RX2. In other words, the value of the data signal at the transmitting end and the value of the data signal at the receiving end are synchronized not only when the power supply voltage drops but also at the timing when the power supply voltage rises after power-on and changes to a normal value.

Further, the retransmission request signal RT22 that is output from the 1/10 counter CTR2 is input to the transmitting circuit TX2. The retransmission request signal RT22 is a signal that becomes H level at the rate of once in ten times of the clock signal output from the oscillation circuit OSC2. By the retransmission request signal RT22, a data value is retransmitted at the rate of once in ten counts even when there is no change in a data value. Therefore, even when a data value that is restored in the receiving circuit RX2 is inverted due to noise or the like, the value can be promptly returned to the correct value.

Further, the 1/10 counter CTR2 is reset by the total pulse signal P20 or the retransmission request signal RT21 that is output from the UVLO circuit UVLO2. Specifically, the 1/10 counter CTR2 is reset by a reset signal RST3 that is output from the OR gate O3 to which the total pulse signal P20 and the retransmission request signal RT21 are input.

The transmitting circuit TX2 outputs the transmission pulse signals P21 and P22 based on the input data signal Din2 and the retransmission request signals RT21 and RT22. The retransmission request signals RT21 and RT22 are input to the receiving circuit RX2 through the primary coils L21 and L22. The receiving circuit RX2 restores the data signal and outputs it as the output data signal Dout2.

The output data signal Dout2 is input to the microcomputer MCU through the OR gate O6. The retransmission request signal RT11 that is output from the UVLO circuit UVLO1 is input to the OR gate O6. Further, a timeout signal TO2 that is output from the timer TM2 is input to the OR gate O6. Thus, the retransmission request signal RT11 and the timeout signal TO2, together with the output data signal Dout2, are input as an error detection signal ED2 to the microcomputer MCU.

The timeout signal TO2 is L level in normal times and becomes H level when the pulse detection signal PD2 is not detected until a specified count (for example, 40 counts). Further, the timeout signal TO2 resets the receiving circuit RX2. Note that, in normal operation, a data value is retransmitted once in ten counts from the transmitting circuit TX2 by the retransmission request signal RT22, and the pulse detection signal PD2 is output from the receiving circuit RX2. Therefore, the timer TM2 does not reach 40 counts. On the other hand, when the transmitting circuit TX2 stops, for example, the timeout signal TO2 is output. The abnormal operation of the transmitting circuit TX2 can be detected by the retransmission request signal RT22.

The timer TM2 counts the clock signal that is output from the oscillation circuit OSC1. Further, the timer TM2 is reset by the pulse detection signal PD2 that is output from the receiving circuit RX2 or the retransmission request signal RT11 that is output from the UVLO circuit UVLO1. Specifically, the timer TM2 is reset by a reset signal RST4 that is output from the OR gate O4 to which the pulse detection signal PD2 and the retransmission request signal RT11 are input.

Other Embodiments

Figure 19:
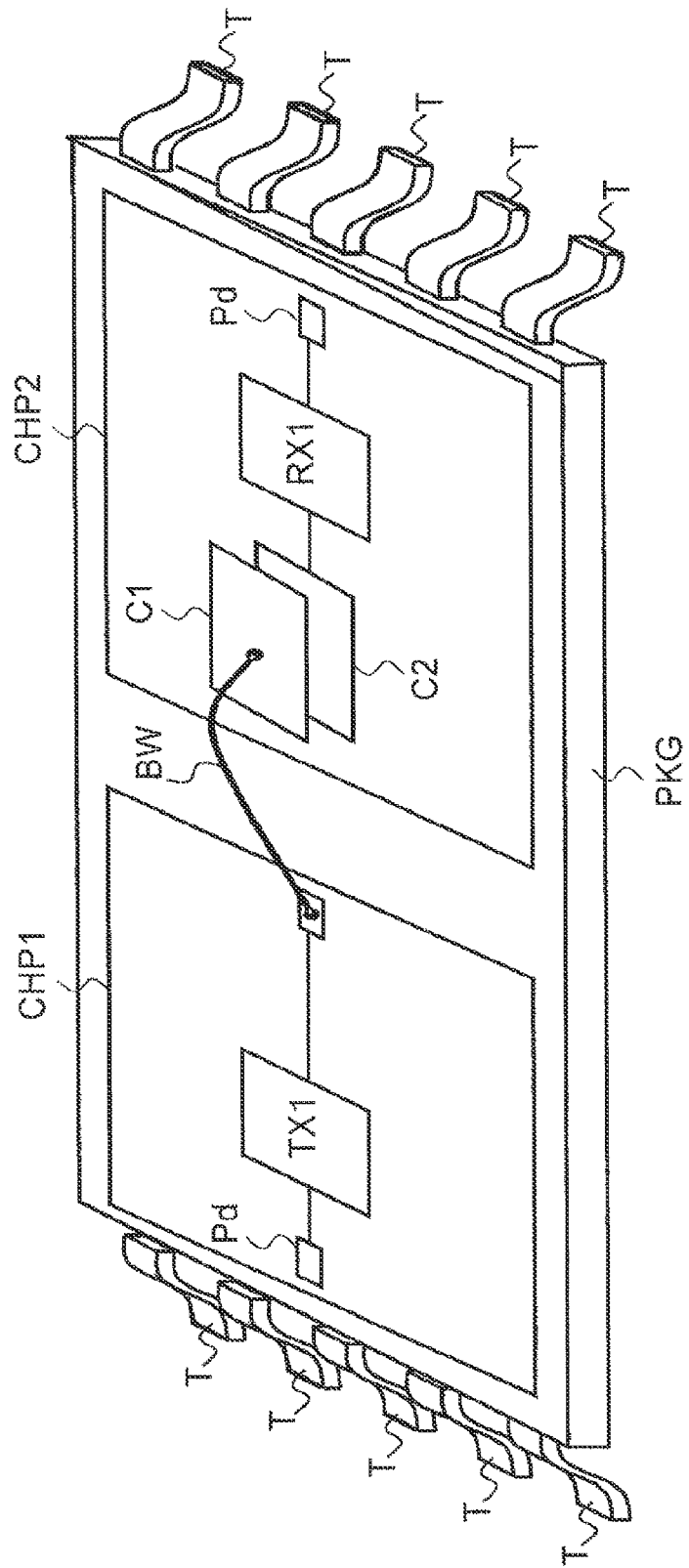
FIG. 19 is a schematic diagram showing an implementation example of a semiconductor device.
Figure 20:
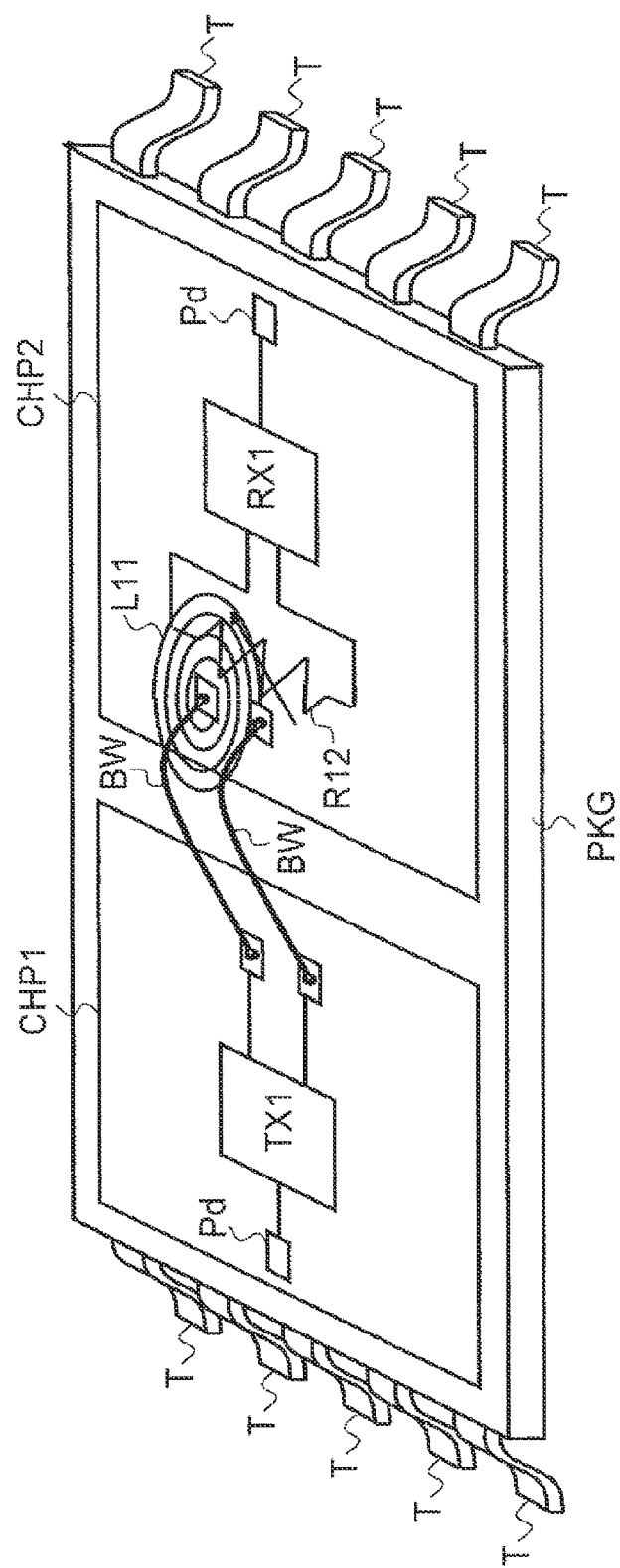
FIG. 20 is a schematic diagram showing an implementation example of a semiconductor device.

An implementation example of a semiconductor device is not limited to the implementation example shown in FIG. 2. Other representative implementation examples of a semiconductor device are described hereinafter with reference to FIGS. 13 to 20. Note that FIGS. 13 to 18 are implementation examples in which a coil is used as the insulation coupler. FIG. 19 is an implementation example in which a capacitor is used as the insulation coupler. FIG. 20 is an implementation example in which a GMR element is used as the insulation coupler.

Figure 13:
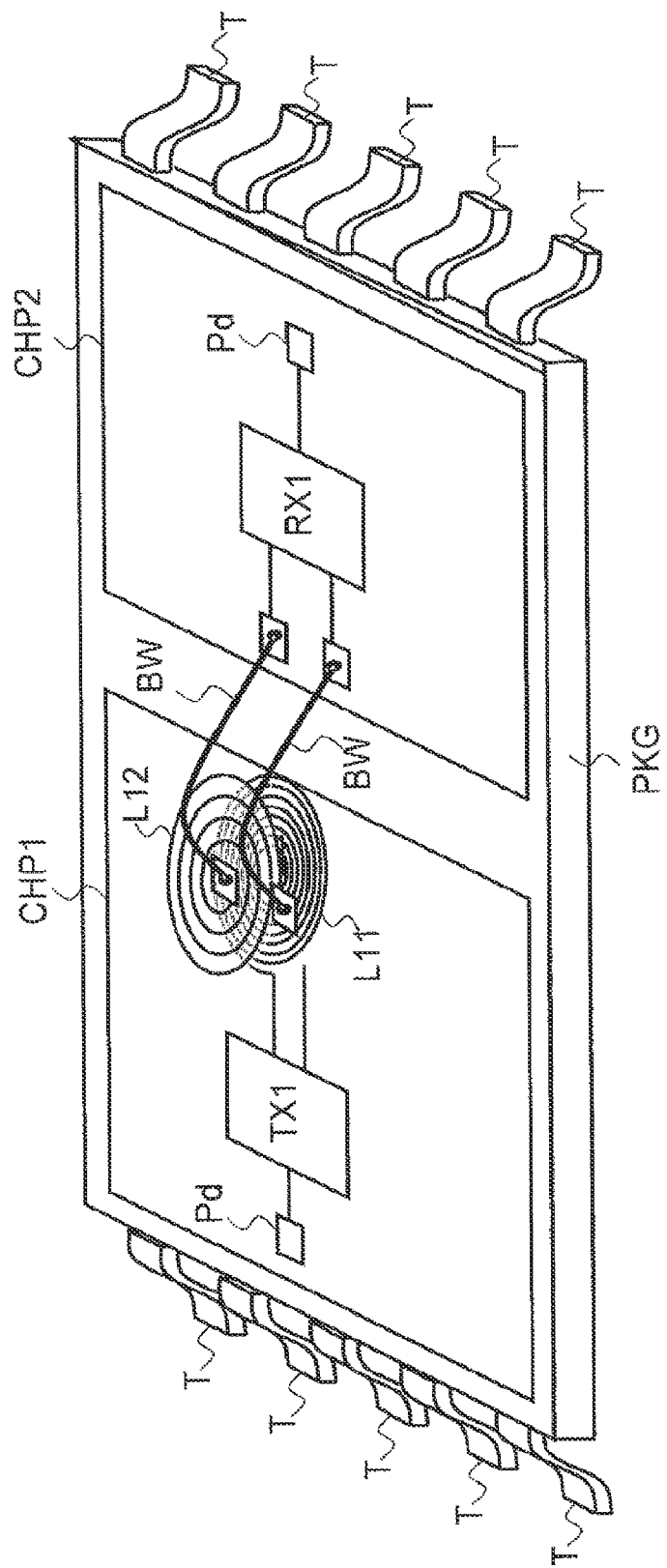
FIG. 13 is a schematic diagram showing an implementation example of a semiconductor device.

In the implementation example shown in FIG. 13, the transmitting circuit TX1 and the primary coil L11 and the secondary coil L12 forming the insulation coupler are formed on the semiconductor chip CHP1, and the receiving circuit RX1 is formed on the semiconductor chip CHP2. Further, on the semiconductor chip CHP1, pads that are connected to the both ends of the secondary coil L12 are formed. On the semiconductor chip CHP2, pads that are connected to the input of the receiving circuit RX1 are formed. The receiving circuit RX1 is connected to the secondary coil L12 formed on the semiconductor chip CHP1 through those pads and bonding wires BW. Note that, in the implementation example shown in FIG. 13, the primary coil L11 and the secondary coil L12 are respectively formed in a first wiring layer and a second wiring layer that are stacked on top of one another in one semiconductor chip.

Figure 14:
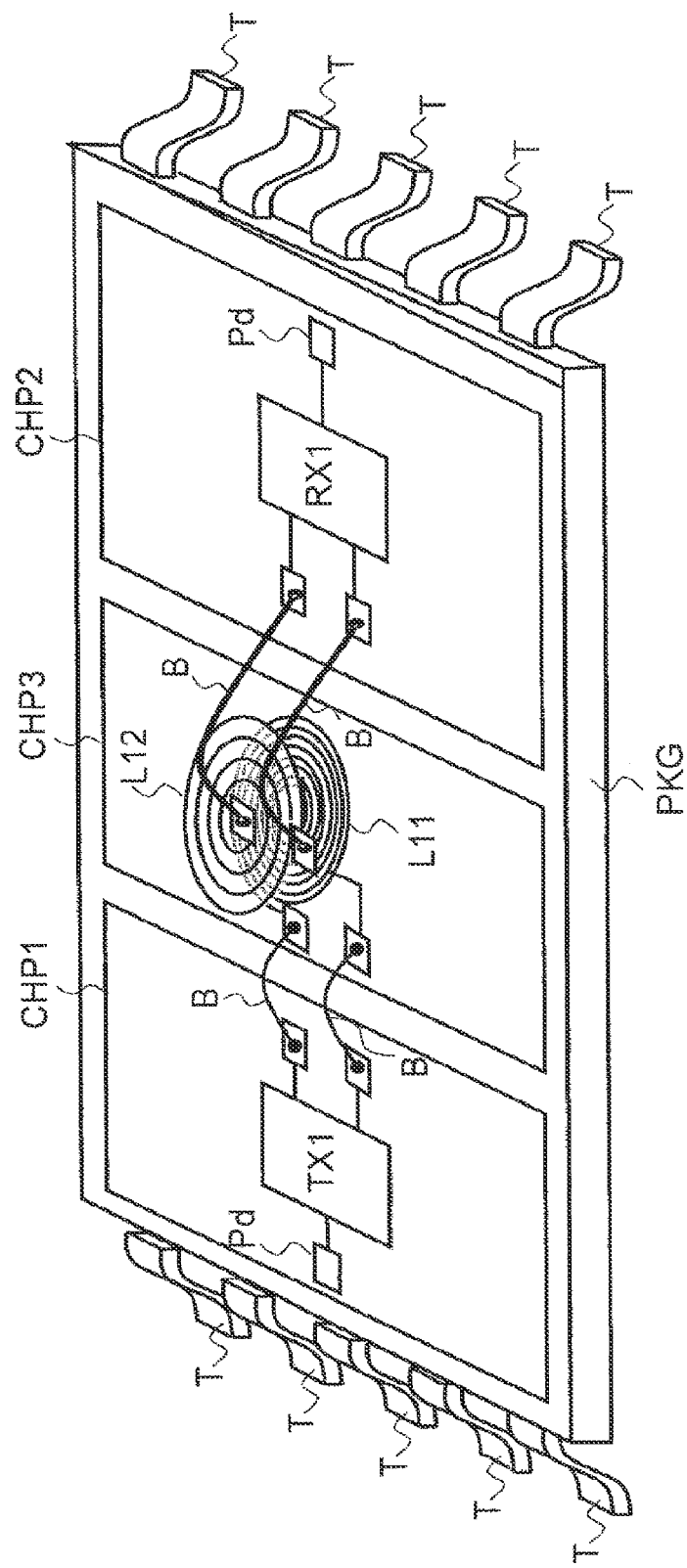
FIG. 14 is a schematic diagram showing an implementation example of a semiconductor device.

In the implementation example shown in FIG. 14, the transmitting circuit TX1 is formed on the semiconductor chip CHP1, the receiving circuit RX1 is formed on the semiconductor chip CHP2, and the primary coil L11 and the secondary coil L12 are formed on a semiconductor chip CHP3 that is different from the semiconductor chips CHP1 and CHP2. Further, on the semiconductor chip CHP1, pads that are connected to the output of the transmitting circuit TX1 are formed. On the semiconductor chip CHP2, pads that are connected to the input of the receiving circuit RX1 are formed. On the semiconductor chip CHP3, pads that are connected to both ends of the primary coil L11 and pads that are connected to both ends of the secondary coil L12 are formed. The transmitting circuit TX1 is connected to the primary coil L11 formed on the semiconductor chip CHP3 through those pads and bonding wires BW. Further, the receiving circuit RX1 is connected to the secondary coil L12 formed on the semiconductor chip CHP3 through those pads and bonding wires BW. Note that, in the implementation example shown in FIG. 14, the primary coil L11 and the secondary coil L12 are respectively formed in a first wiring layer and a second wiring layer that are stacked on top of one another in one semiconductor chip.

Figure 15:
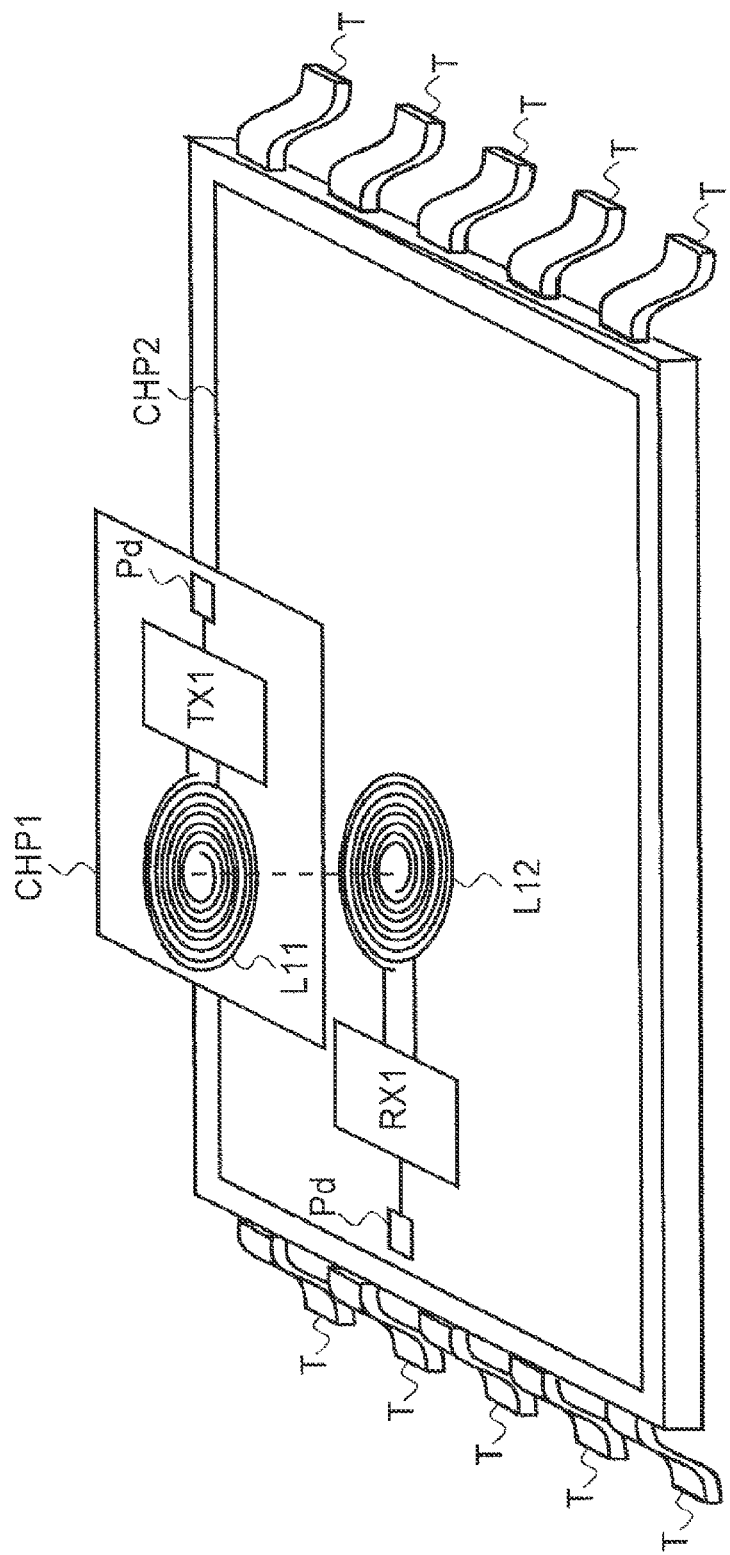
FIG. 15 is a schematic diagram showing an implementation example of a semiconductor device.

In the implementation example shown in FIG. 15, the transmitting circuit TX1 and the primary coil L11 are formed on the semiconductor chip CHP1, the receiving circuit RX1 and the secondary coil L12 are formed on the semiconductor chip CHP2, and the semiconductor chip CHP1 and the semiconductor chip CHP2 are stacked on top of one another. Further, the semiconductor chip CHP1 and the semiconductor chip CHP2 are placed so that the center position of the primary coil L11 and the center position of the secondary coil L12 are collinear when stacked.

Figure 16:
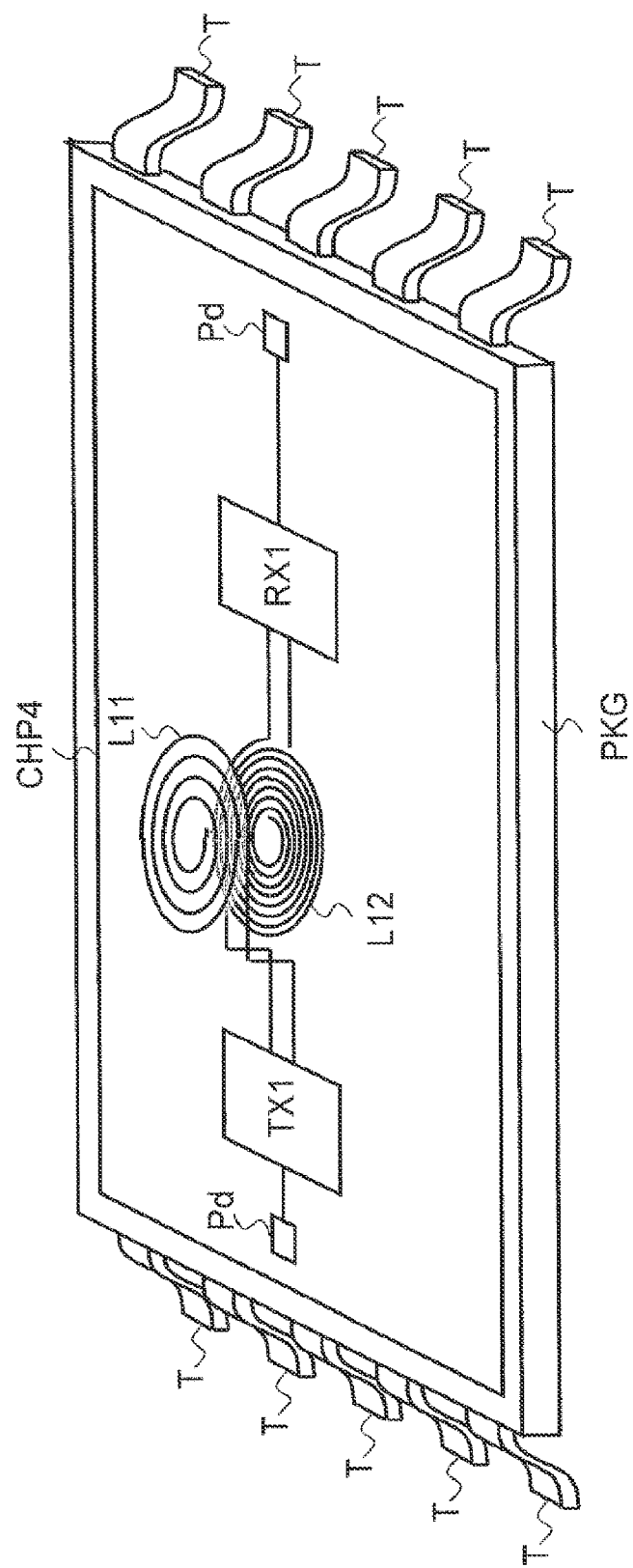
FIG. 16 is a schematic diagram showing an implementation example of a semiconductor device.

In the implementation example shown in FIG. 16, the transmitting circuit TX1, the receiving circuit RX1, and the primary coil L11 and the secondary coil L12 forming the insulation coupler are formed on a common semiconductor chip CHP4. In the example of FIG. 16, the primary coil L11 and the secondary coil L12 are respectively formed in a first wiring layer and a second wiring layer that are stacked on top of one another on the semiconductor chip CHP4. An area where the transmitting circuit TX1 is placed and an area where the receiving circuit RX1 is placed are insulated from each other by an insulating layer formed in a substrate of the semiconductor chip CHP4.

Figure 17:
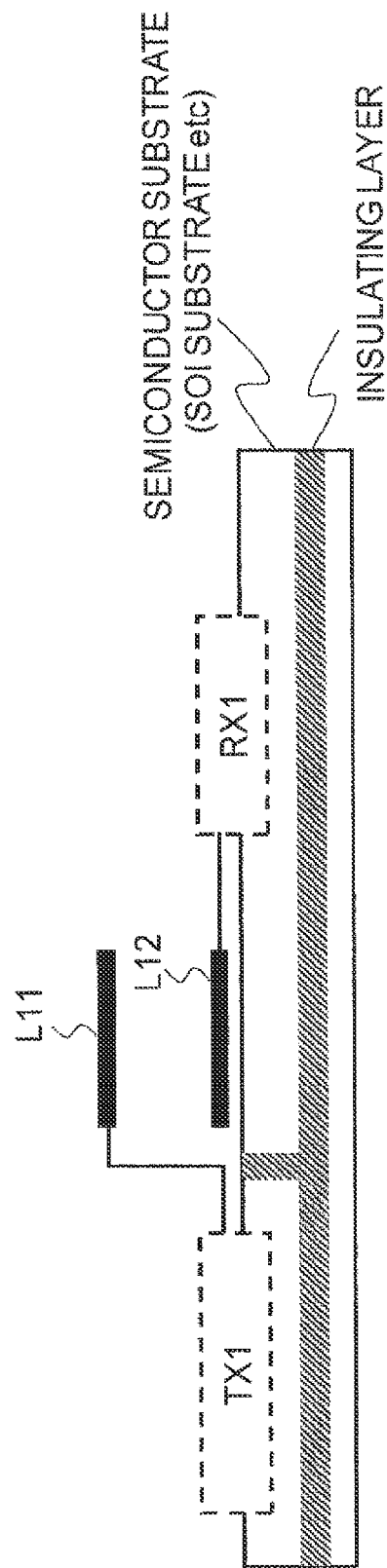
FIG. 17 is a schematic diagram showing an implementation example of a semiconductor device.
Figure 18:
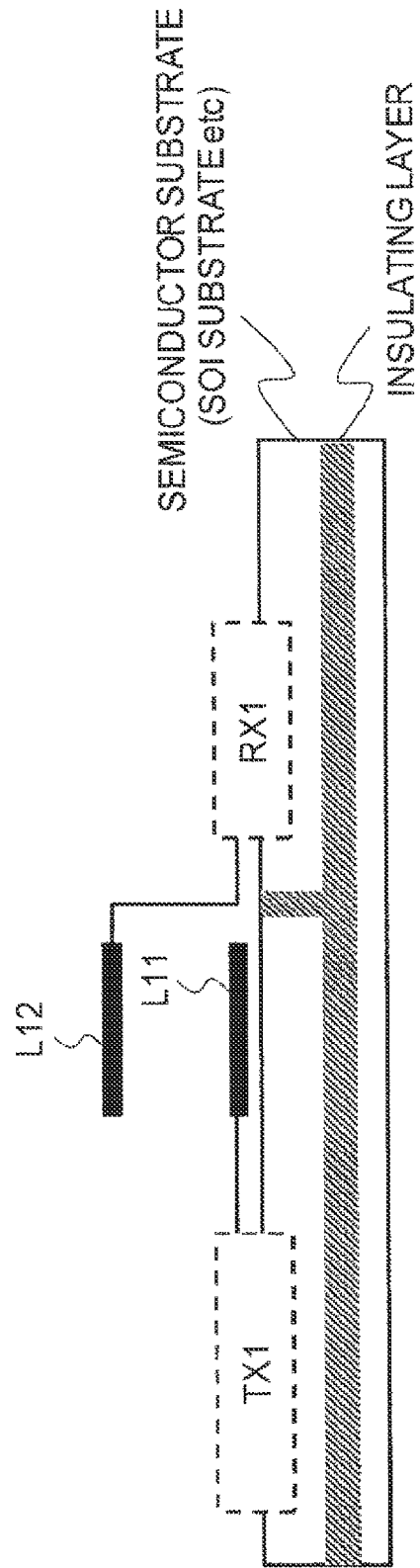
FIG. 18 is a schematic diagram showing an implementation example of a semiconductor device.

FIGS. 17 and 18 are cross-sectional views of the substrate of the semiconductor chip CHP4 shown in FIG. 16. In the example of FIG. 17, the area where the transmitting circuit TX1 is formed and the area where the receiving circuit RX1 is formed are electrically isolated by an insulating layer. The primary coil L11 and the secondary coil L12 are formed in the area where the receiving circuit RX1 is formed. On the other hand, in the example of FIG. 18, the area where the transmitting circuit TX1 is formed and the area where the receiving circuit RX1 is formed are electrically isolated by an insulating layer. The primary coil L11 and the secondary coil L12 are formed in the area where the transmitting circuit TX1 is formed.

FIG. 19 is an example in which the coil used as the insulation coupler in the implementation example shown in FIG. 2 is replaced by a capacitor. More specifically, the primary coil L11 is replaced by one electrode C11 of a capacitor, and the secondary coil L12 is replaced by the other electrode C12 of the capacitor.

FIG. 20 is an example in which the coil used as the insulation coupler in the implementation example shown in FIG. 2 is replaced by a GMR element. More specifically, the primary coil L11 is as it is, and the secondary coil L12 is replaced by a GMR element R12.

As described above, the type of the insulation coupler and the placement of the insulation coupler are not particularly limited. Note that, although the insulation coupler is formed on a semiconductor chip in the above description, the insulation coupler may be mounted as an external part.

The target of control of the semiconductor device according to the first to third embodiments is a power transistor which is typified by an insulated gate bipolar transistor (IGBT), for example. In this case, the semiconductor device according to the first to third embodiments controls the conductive state between a power supply and a load by controlling ON and OFF of the power transistor in accordance with the data Dout1 reproduced by the receiving circuit.

Figure 21:
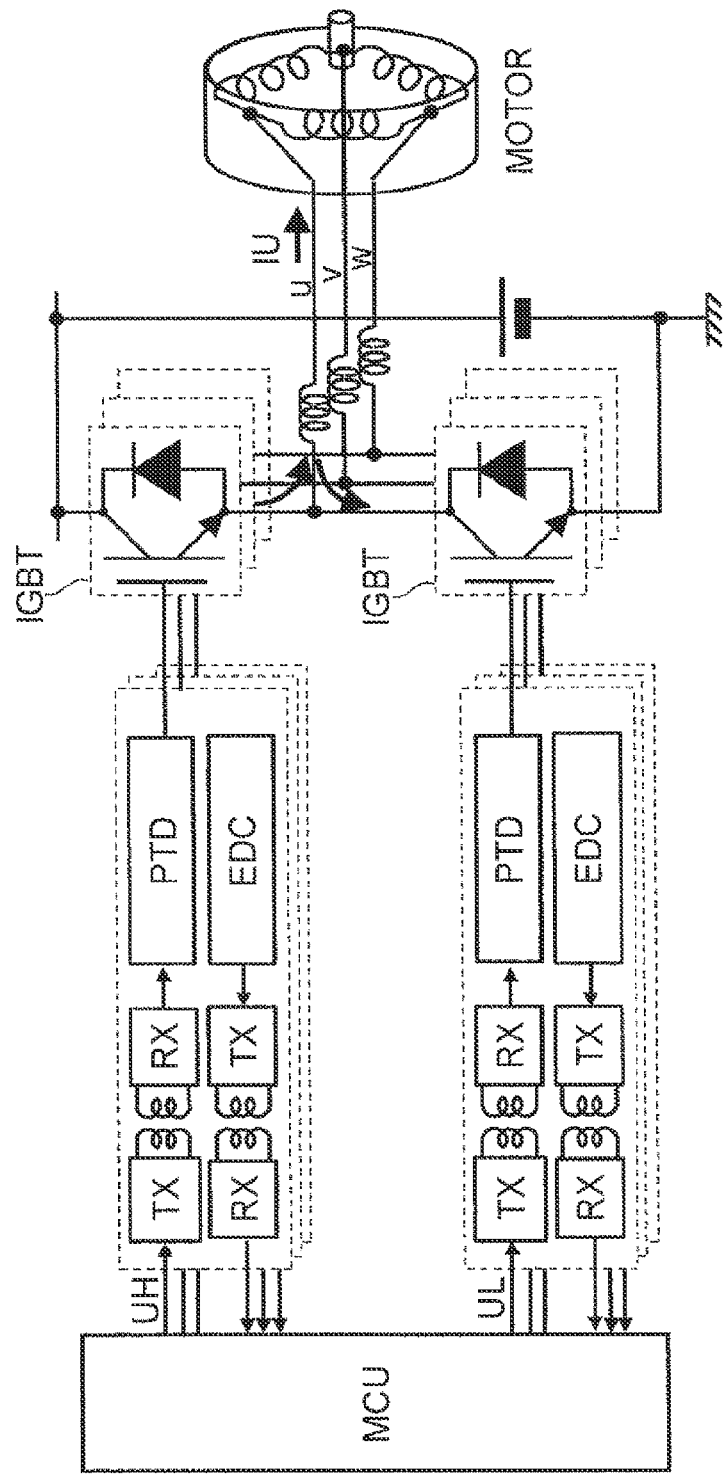
FIG. 21 is a diagram showing an inverter device to which a semiconductor device is applied.

Further, the semiconductor device according to the first to third embodiments is applied to an inverter device that drives a three-phase motor (load) as shown in FIG. 21, for example. The inverter device shown in FIG. 21 includes three (total six) power transistor drivers PTD and error detection circuits EDC corresponding to U-phase, V-phase, and W-phase on the High side and Low side. Control signals (for example, UH and UL) that are output from the microcomputer MCU are transmitted to the power transistor drivers PTD through the transmitting circuit TX1, the coil and the receiving circuit RX1, and ON and OFF of the IGBTs, which are the control target, are controlled. On the other hand, an error signal that is detected by the error detection circuits EDC is transmitted to the microcomputer MCU through the transmitting circuit TX1, the coil and the receiving circuit RX1.

Figure 22:
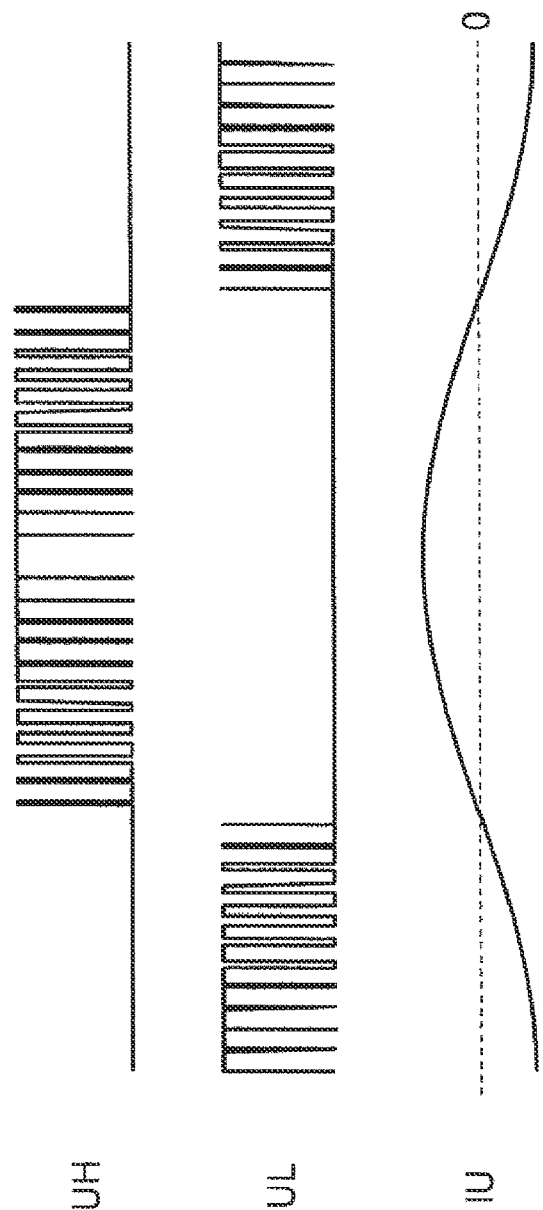
FIG. 22 is a timing chart showing an operation of an inverter device to which a semiconductor device is applied.

As shown in the graph of FIG. 22, the control signals (for example, UH and UL) that are output from the microcomputer MCU are PWM control signals, and current (for example, IU) flowing through the motor is controlled in an analog fashion. The control signals (for example, UH and UL) correspond to the input data signal Din1 in the first and second embodiments.

Figure 23:
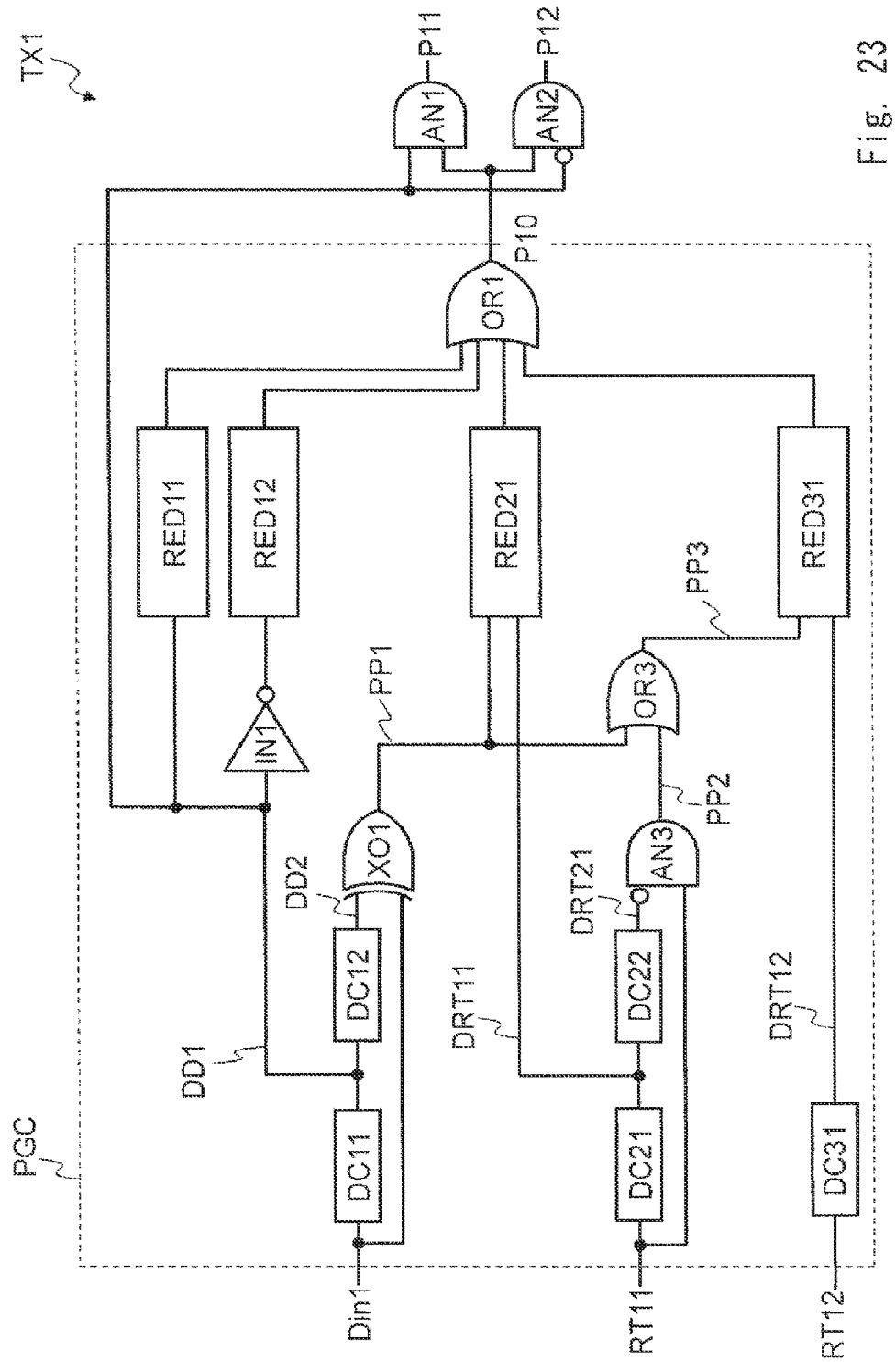
FIG. 23 is a circuit diagram showing an example of a specific circuit configuration of a transmitting circuit TX1 according to an alternative example of the second embodiment.
Figure 24:
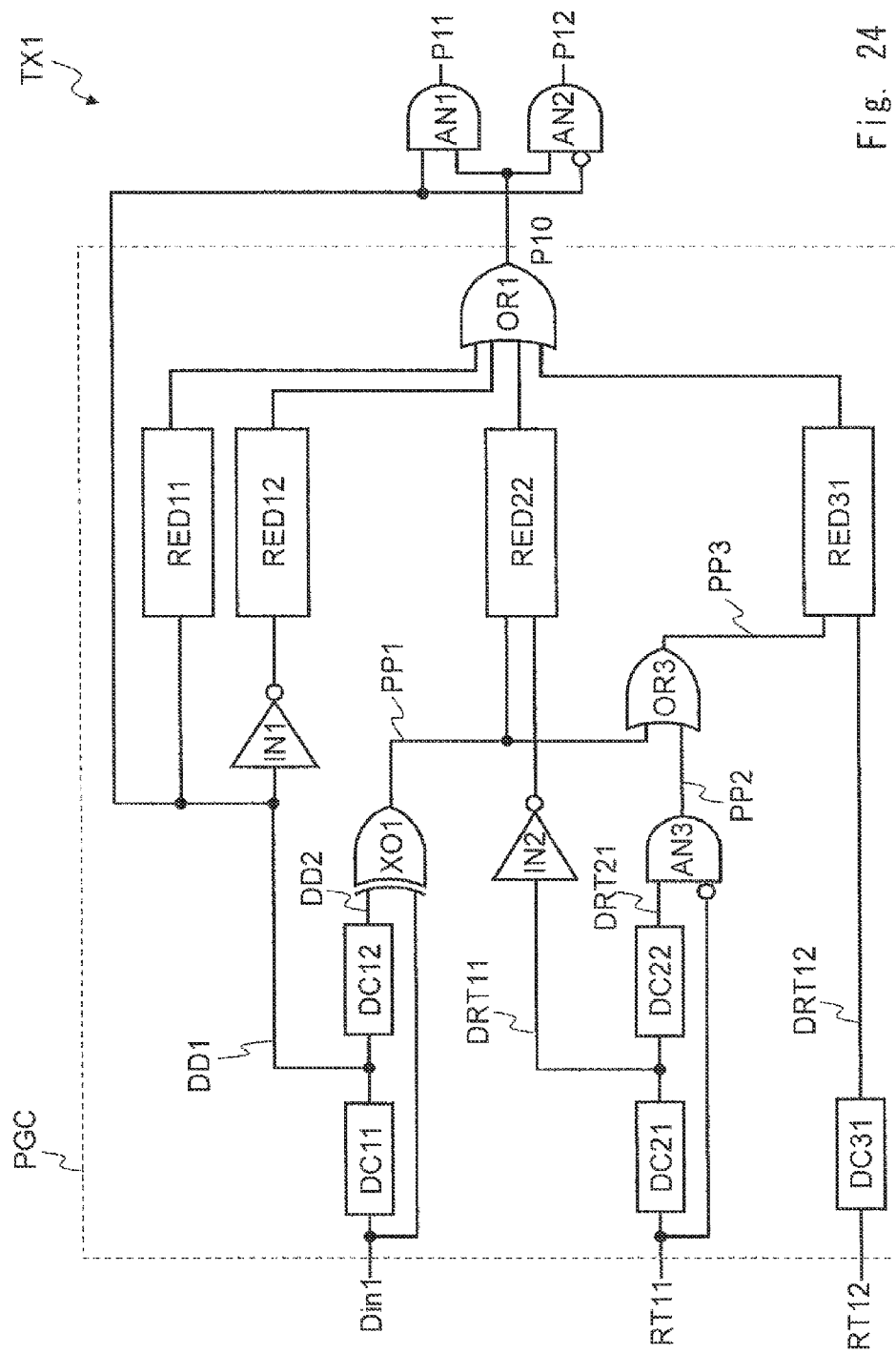
FIG. 24 is a circuit diagram showing an example of a specific circuit configuration of the transmitting circuit TX1 according to an alternative example of the second embodiment.

Further, an alternative example of the second embodiment is described hereinafter with reference to FIGS. 23 to 26. FIGS. 23 and 24 are circuit diagrams showing an example of a specific circuit configuration of the transmitting circuit TX1 according to an alternative example of the second embodiment.

In FIG. 23, the rising edge detection circuit RED22 is not included compared with FIG. 10. Therefore, a data signal is retransmitted only at the rising edge of the delayed retransmission request signal DRT11, and a data signal is not retransmitted at the falling edge thereof. Accordingly, as a logic circuit that generates the prohibited period signal PP2, an AND gate A3 that has an inverter (which is shown by ○ in FIG. 23) at the input of the delayed retransmission request signal DRT11 is used in place of the XOR gate XO2.

In FIG. 24, the rising edge detection circuit RED21 is not included compared with FIG. 10. Therefore, a data signal is retransmitted only at the falling edge of the delayed retransmission request signal DRT11, and a data signal is not retransmitted at the rising edge thereof. Accordingly, as a logic circuit that generates the prohibited period signal PP2, an AND gate A3 that has an inverter (which is shown by ○ in FIG. 23) at the input of the delayed retransmission request signal DRT21 is used in place of the XOR gate XO2.

Figure 25:
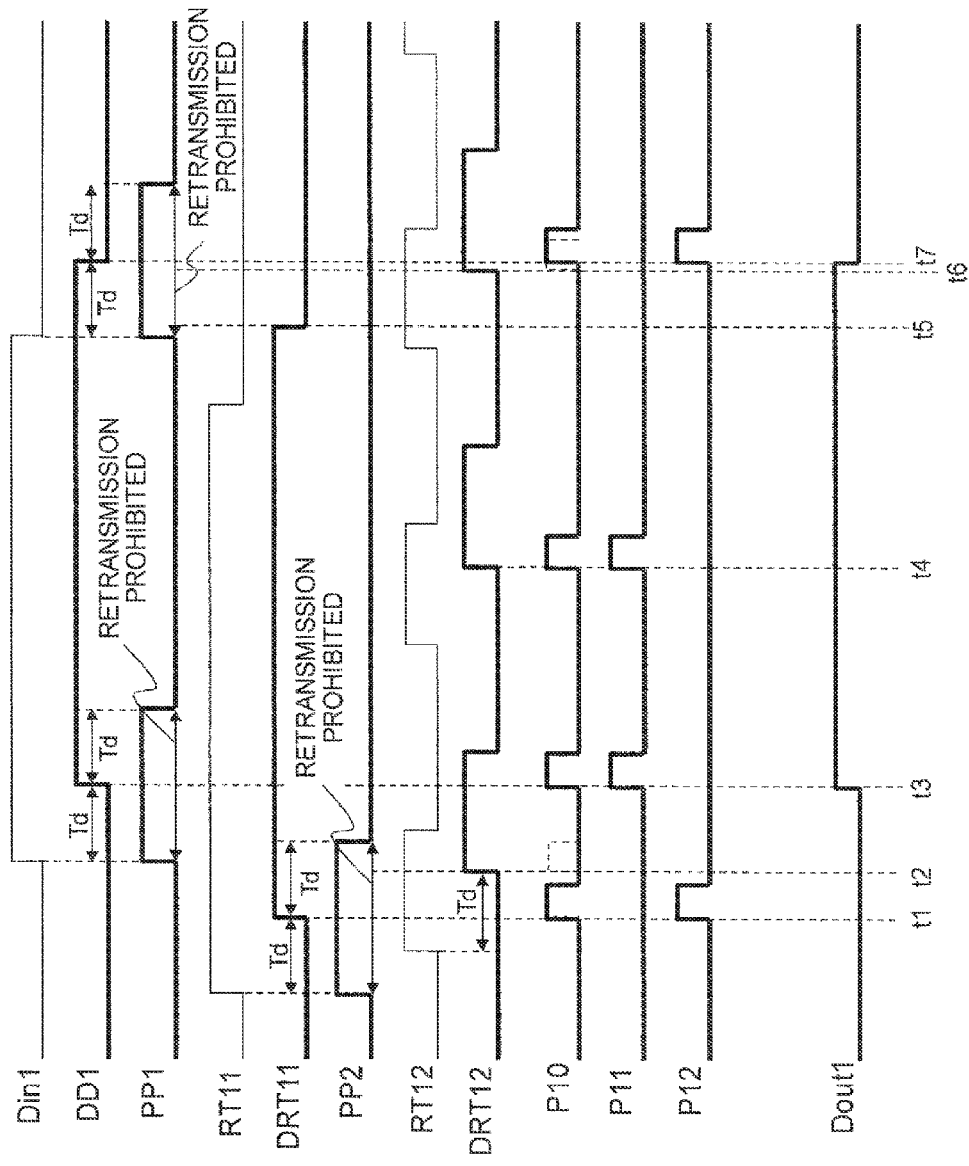
FIG. 25 is a timing chart showing an example of an operation of the transmitting circuit TX1 according to an alternative example of the second embodiment.
Figure 26:
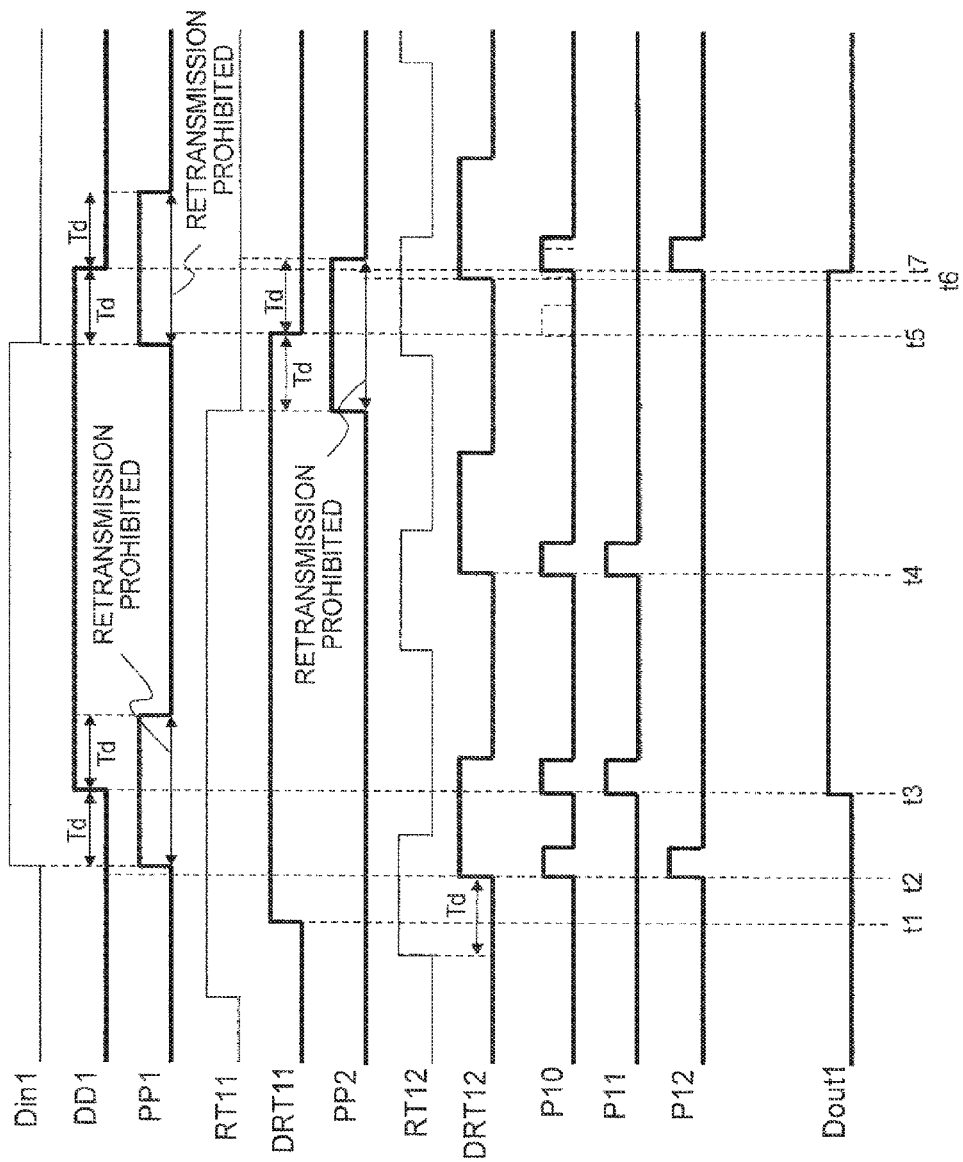
FIG. 26 is a timing chart showing an example of an operation of the transmitting circuit TX1 according to an alternative example of the second embodiment.

FIGS. 25 and 26 are timing charts showing an example of the operation of the transmitting circuit TX1 according to an alternative example of the second embodiment. FIG. 25 corresponds to the transmitting circuit TX1 of FIG. 23, and FIG. 26 corresponds to the transmitting circuit TX1 of FIG. 24.

In FIG. 25, the total pulse signal P10 is not output at time t5, which is the falling edge of the delayed retransmission request signal DRT11, compared with the timing chart of FIG. 11. Further, the prohibited period signal PP2 is not output near time t5, and L level is maintained. The other points are the same as in FIG. 11 and not redundantly described.

In FIG. 26, the total pulse signal P10 and the transmission pulse signal P12 are not output at time t1, which is the rising edge of the delayed retransmission request signal DRT11, and L level is maintained, compared with the timing chart of FIG. 11. Further, the prohibited period signal PP2 is not output near time t1, and L level is maintained. Therefore, at time t2, which is the rising edge of the delayed retransmission request signal DRT12, the total pulse signal P10 and the transmission pulse signal P12 are output, though they are not output in FIG. 11. The other points are the same as in FIG. 11 and not redundantly described.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a transmitting circuit that operates in a first power supply system and outputs a pulse signal based on an input data signal and an input first retransmission request signal;
   a receiving circuit that operates in a second power supply system different from the first power supply system and restores a delayed data signal based on the pulse signal; and
   an insulation coupler that couples the transmitting circuit and the receiving circuit by a magnetic field or an electric field, wherein
   the transmitting circuit generates the delayed data signal and a first delayed retransmission request signal by delaying the input data signal and the first retransmission request signal, respectively, and further generates a prohibiting signal during a first specified period from a first time before an edge of the delayed data signal to a second time after the edge of the delayed data signal and outputs the pulse signal at the edge of the delayed signal and an edge of the first delayed retransmission request signal based on the prohibiting signal.

2. The semiconductor device according to claim 1, wherein the transmitting circuit includes a first logic circuit that generates a period signal for prohibiting output of the pulse signal during the first specified period across the edge of the delayed data signal.

3. The semiconductor device according to claim 2, wherein the input data signal and a signal generated by further delaying the delayed data signal are input to the first logic circuit.

4. The semiconductor device according to claim 1, wherein
   a second retransmission request signal is further input to the transmitting circuit, and
   the transmitting circuit further outputs the pulse signal at an edge of a second delayed retransmission request signal generated by delaying the second retransmission request signal, and prohibits output of the pulse signal at an edge of the second retransmission request signal during the first specified period across the edge of the delayed data signal and a second specified period across an edge of the first delayed retransmission request signal.

5. The semiconductor device according to claim 4, wherein the transmitting circuit includes a second logic circuit that generates a period signal for prohibiting output of the pulse signal during the second specified period across the edge of the first delayed retransmission request signal.

6. The semiconductor device according to claim 5, wherein the first retransmission request signal and a signal generated by further delaying the first delayed retransmission request signal are input to the second logic circuit.

7. The semiconductor device according to claim 4, further comprising:
an under voltage lock out circuit that outputs the first or second retransmission request signal when a voltage of the first power supply system is lower than a specified value.

8. The semiconductor device according to claim 4, further comprising:
a signal generation circuit that outputs the first or second retransmission request signal on a regular basis.

9. The semiconductor device according to claim 8, further comprising:
a timer that outputs an error signal when the receiving circuit does not detect the pulse signal for a third specified period.

10. The semiconductor device according to claim 1, further comprising:
a microcomputer that outputs the input data signal to the transmitting circuit; and
a driving circuit that receives input of the data signal restored by the receiving circuit.

11. The semiconductor device according to claim 10, further comprising:
a power transistor that is driven by the driving circuit; and
a motor where current is controlled by ON and OFF of the power transistor.

12. The semiconductor device according to claim 1, wherein the insulation coupler includes a coil.

13. A data transmission method comprising:
generating a delayed data signal and a first delayed retransmission request signal by delaying an input data signal and a first retransmission request signal, respectively;
generating a prohibiting signal during a specified period from a first time before an edge of the delayed data signal to a second time after the edge of the delayed data signal; and
outputting the pulse signal at the edge of the delayed signal and an edge of the first delayed retransmission request signal based on the prohibiting signal.

* * * * *